US011153517B2

(12) United States Patent
Kim et al.

(10) Patent No.: US 11,153,517 B2
(45) Date of Patent: Oct. 19, 2021

(54) DYNAMIC VISION SENSOR DEVICE INCLUDING BUFFER

(71) Applicant: SAMSUNG ELECTRONICS CO., LTD., Suwon-si (KR)

(72) Inventors: Jeongseok Kim, Suwon-si (KR); Junseok Kim, Hwaseong-si (KR); Yunjae Suh, Incheon (KR); Seol Namgung, Seoul (KR); Jongwoo Bong, Seoul (KR); Seungnam Choi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/007,320

(22) Filed: Aug. 31, 2020

(65) Prior Publication Data
US 2021/0250528 A1   Aug. 12, 2021

(30) Foreign Application Priority Data
Feb. 10, 2020   (KR) .................. KR10-2020-0015477

(51) Int. Cl.
*H04N 5/351* (2011.01)
*H03F 3/45* (2006.01)
*H03K 5/24* (2006.01)
*H04N 5/3745* (2011.01)
*H04N 5/369* (2011.01)
*G01J 1/44* (2006.01)

(52) U.S. Cl.
CPC ................ *H04N 5/351* (2013.01); *G01J 1/44* (2013.01); *H03F 3/45179* (2013.01); *H03K 5/24* (2013.01); *H04N 5/3698* (2013.01); *H04N 5/3745* (2013.01); *G01J 2001/4413* (2013.01); *H03F 2200/129* (2013.01)

(58) Field of Classification Search
CPC .... H04N 5/351; H04N 5/3698; H04N 5/3745; H03K 5/24; G01J 1/44; G01J 2001/4413; H03F 3/45179; H03F 2200/129
See application file for complete search history.

(56) References Cited

U.S. PATENT DOCUMENTS 7,728,269 B2   6/2010   Lichtsteiner et al.
9,520,426 B2   12/2016   Kim et al.
(Continued)

FOREIGN PATENT DOCUMENTS

KR   1020180024384 A   3/2018

*Primary Examiner* — Twyler L Haskins
*Assistant Examiner* — Angel L Garces-Rivera
(74) *Attorney, Agent, or Firm* — Volentine, Whitt & Francos, PLLC

(57) ABSTRACT

A dynamic vision sensor device includes a photo detector that outputs a detection signal based on light incident from outside, a log amplifier that receives the detection signal from the photo detector through a first node, amplifies the received detection signal, and outputs the amplified detection signal to a second node, a differencing amplifier that outputs a difference signal based on a change in an intensity of the amplified detection signal, and an event determination circuit that determines an event based on the difference signal. The log amplifier includes a first buffer connected between the first node and a third node, an amplifier connected between the third node and the second node, and a feedback circuit connected between the second node and the first node.

20 Claims, 19 Drawing Sheets

(56) References Cited

U.S. PATENT DOCUMENTS

| | | |
|---|---|---|
| 9,681,081 B2 | 6/2017 | Serrano Gotarredona et al. |
| 9,739,660 B2 | 8/2017 | Suh et al. |
| 10,401,217 B2 | 3/2019 | Suh et al. |
| 10,567,679 B2 * | 2/2020 | Berner .................. H04N 5/341 |
| 10,602,083 B2 * | 3/2020 | Berner .................. G06F 11/004 |
| 2018/0191972 A1 | 7/2018 | Berner et al. |
| 2019/0052820 A1 | 2/2019 | Berner |
| 2019/0141265 A1 | 5/2019 | Finateu et al. |

* cited by examiner

DYNAMIC VISION SENSOR DEVICE INCLUDING BUFFER

CROSS-REFERENCE TO RELATED APPLICATIONS

This application claims priority under 35 U.S.C. § 119 to Korean Patent Application No. 10-2020-0015477 filed on Feb. 10, 2020, in the Korean Intellectual Property Office, the disclosure of which is incorporated by reference herein in its entirety.

BACKGROUND

Embodiments of the disclosure herein relate to a semiconductor device, and more particularly, relate to a dynamic vision sensor including a buffer.

An image device refers to a device that generates an electrical signal based on light incident from outside. As performance of the image device is improved, the burden of processing image data increases. Nowadays, there is being developed an event-based sensor to output an event signal depending on the amount of change in a magnitude of light incident from outside, like a human iris, for example, a dynamic vision sensor. Because the event-based sensor processes only image data corresponding to a light change, the burden of processing image data may decrease.

In general, the event-based sensor outputs an event signal by using various components such as a light detector and an amplifier. The light detector of the event-based sensor may fail to generate a photocurrent of a sufficient amount in a low-illuminance environment. An event signal generated based on a photocurrent, the magnitude of which is smaller than a reference magnitude, may miss information corresponding to the light change. As such, the performance of the event-based sensor may be reduced in the low-illuminance environment.

SUMMARY

Embodiments of the disclosure provide a dynamic vision sensor including a buffer such that performance associated with detection of a light change is improved.

According to an exemplary embodiment, a dynamic vision sensor device includes a photo detector that outputs a detection signal based on light incident from outside. A log amplifier receives the detection signal from the photo detector through a first node, amplifies the received detection signal, and outputs the amplified detection signal to a second node. A differencing amplifier outputs a difference signal based on a change in an intensity of the amplified detection signal. An event determination circuit determines an event based on the difference signal. The log amplifier includes a first buffer connected between the first node and a third node, an amplifier connected between the third node and the second node, and a feedback circuit connected between the second node and the first node.

According to an exemplary embodiment, a dynamic vision sensor device includes a photo detector that outputs a detection signal based on light incident from outside. A log amplifier receives the detection signal from the photo detector through a first node, amplifies the received detection signal, and outputs the amplified detection signal to a second node. A differencing amplifier outputs a difference signal based on a change in an intensity of the amplified detection signal. An event determination circuit determines an event based on the difference signal. The log amplifier includes a first transistor that is connected between a power node and a third node and operates in response to a voltage of the first node, a second transistor that is connected between the second node and a ground node and operates in response to a voltage of the third node, and a third transistor that is connected between the power node and the first node and operates in response to a voltage of the second node.

According to an exemplary embodiment, a dynamic vision sensor device includes a photo detector that outputs a detection signal based on light incident from outside. A log amplifier receives the detection signal from the photo detector through a first node, amplifies the received detection signal, and outputs the amplified detection signal to a second node. A differencing amplifier outputs a difference signal based on a change in an intensity of the amplified detection signal. An event determination circuit determines an event based on the difference signal. The log amplifier further includes a first transistor that is connected between a third node and a ground node and operates in response to a voltage of the first node, a second transistor that is connected between a power node and the second node and operates in response to a voltage of the third node, and a third transistor that is connected between the power node and the first node and operates in response to a voltage of the second node.

BRIEF DESCRIPTION OF THE FIGURES

The above and other objects and features of the disclosure will become apparent by describing in detail exemplary embodiments thereof with reference to the accompanying drawings.

DETAILED DESCRIPTION

Figure 1:
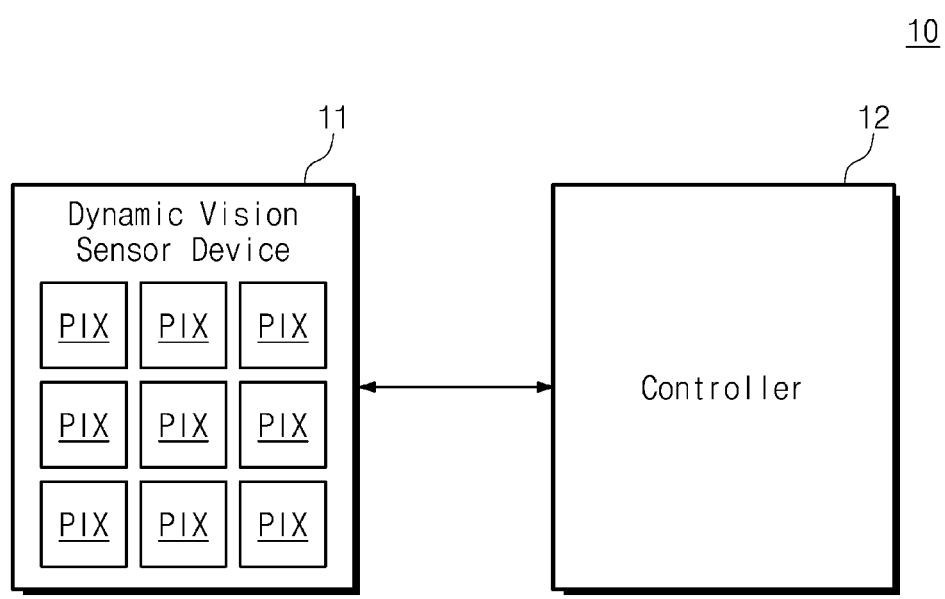
FIG. 1 is a block diagram illustrating an image device according to an embodiment of the disclosure.

Below, embodiments of the disclosure may be described in detail and clearly to such an extent that an ordinary one in the art easily implements the disclosure. Below, for convenience of description, similar components are expressed by using the same or similar reference numerals.

FIG. 1 is a block diagram illustrating an image device according to an embodiment of the disclosure. Referring to FIG. 1, an image device 10 may include a dynamic vision sensor device 11 and a controller 12. The controller 12 may be configured to control the dynamic vision sensor device 11. For example, the controller 12 may be an image signal processor or a driver or a processor configured to control the dynamic vision sensor device 11.

The dynamic vision sensor device 11 may be an image sensor device configured to convert light incident from outside into an electrical or digital signal. For example, the dynamic vision sensor device 11 may be an image sensor device that generates a digital signal based on the amount of change of an incident light.

The dynamic vision sensor device 11 may include a plurality of pixel circuits PIXs. For example, the pixel circuit PIX may be a circuit corresponding to a pixel of the dynamic vision sensor device 11. An example is illustrated in FIG. 1 as the dynamic vision sensor device 11 includes nine pixel circuits PIXs, but the disclosure is not limited thereto. For example, the number of pixel circuits PIXs included in the dynamic vision sensor device 11 may increase or decrease.

In an exemplary embodiment, the pixel circuit PIX may generate an electrical signal or a digital signal based on light incident from outside and may output the generated electrical signal or digital signal to the controller 12. The controller 12 may generate image information based on the electrical signal or the digital signal received from the pixel circuit PIX.

In an exemplary embodiment, each of the pixel circuits PIXs may be an event-based sensor. Each of the pixel circuits PIXs may be configured to sense a change in the amount of light incident from outside and to asynchronously output an event signal corresponding to the sensed change to the controller 12.

Figure 2:
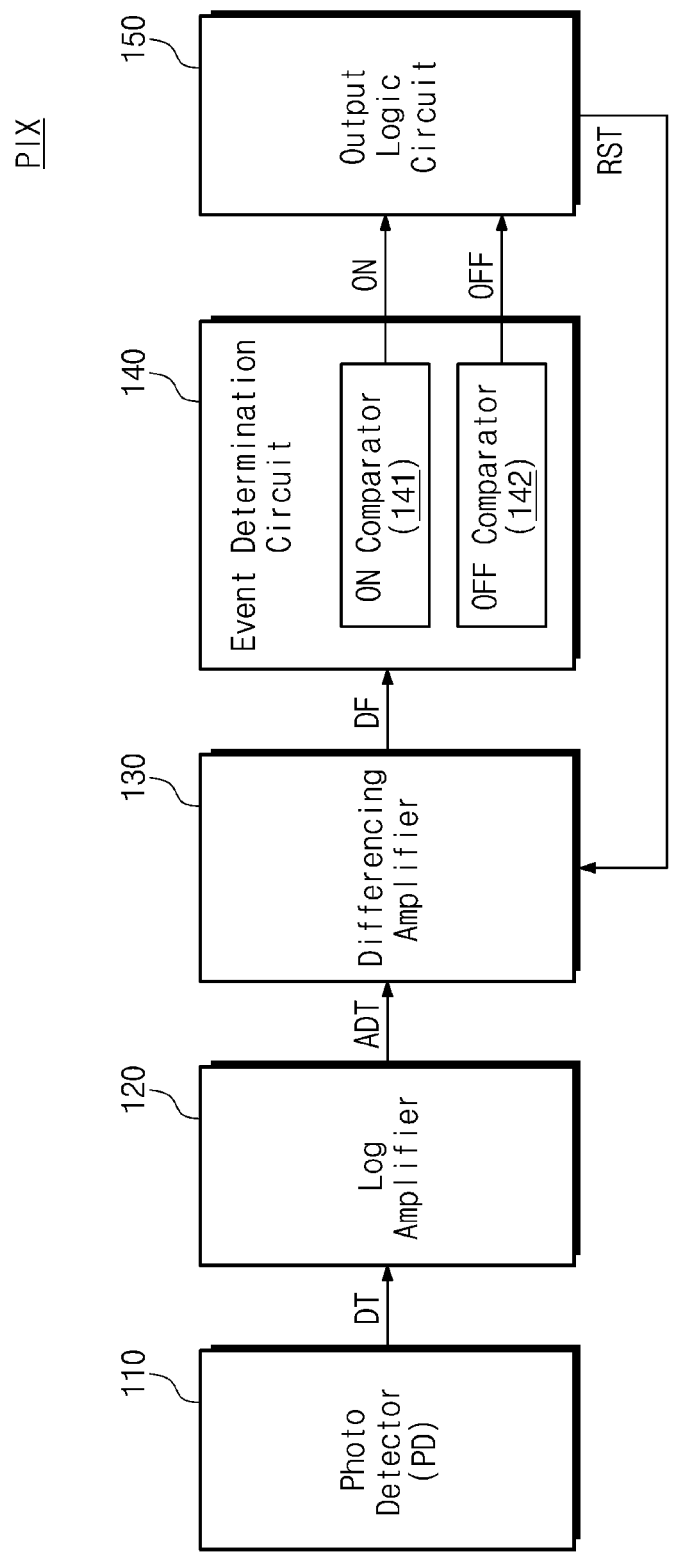
FIG. 2 is a block diagram illustrating a pixel circuit of a dynamic vision sensor device of FIG. 1.

FIG. 2 is a block diagram illustrating a pixel circuit of a dynamic vision sensor device of FIG. 1. For example, the pixel circuit PIX included in the dynamic vision sensor device 11 of FIG. 1 will be described with reference to FIG. 2. The pixel circuit PIX may include a photo detector 110, a log amplifier 120, a differencing amplifier 130, an event determination circuit 140, and an output logic circuit 150.

The photo detector 110 may generate a detection signal DT being an electrical signal, based on light incident from outside. The photo detector 110 may include a photoelectric conversion element. For example, the photo detector 110 may be a photo diode that converts light energy of light reflected by a subject into electrical energy. In an exemplary embodiment, the intensity of the detection signal DT may be proportional to the intensity of light incident from outside.

The log amplifier 120 may receive the detection signal DT from the photo detector 110. The log amplifier 120 may output an amplified detection signal ADT. For example, the log amplifier 120 may be a converter that converts a photocurrent or photo charges in the form of a voltage. The log amplifier 120 may be an amplifier that amplifies the detection signal DT in a log scale.

The differencing amplifier 130 may receive the amplified detection signal ADT from the log amplifier 120. The differencing amplifier 130 may output a difference signal DF based on a change in the intensity of the amplified detection signal ADT (e.g., a variation in a voltage level). A voltage level of the difference signal DF may be set to a reset voltage under control of the output logic circuit 150, that is, by a reset signal RST received from the output logic circuit 150. For example, the differencing amplifier 130 may be a capacitive feedback amplifier (CFA).

The event determination circuit 140 may receive the difference signal DF from the differencing amplifier 130. The event determination circuit 140 may determine an event corresponding to a change of light incident onto the photo detector 110, based on the difference signal DF. In this case, the event may include an ON event indicating that the intensity of light incident onto the photo detector 110 increases and an OFF event indicating that the intensity of light incident onto the photo detector 110 decreases. The event determination circuit 140 may output an ON event signal ON or an OFF event signal OFF based on the determined event.

The event determination circuit 140 may include an ON comparator 141 and an OFF comparator 142. The ON comparator 141 may compare a voltage level of the difference signal DF with an ON reference value and may determine an ON event based on a comparison result. The OFF comparator 142 may compare the voltage level of the difference signal DF with an OFF reference value and may determine an OFF event based on a comparison result.

In an exemplary embodiment, when the intensity of light incident onto the photo detector 110 increases over a reference interval, the ON comparator 141 may determine the ON event to output the ON event signal ON. In detail, the differencing amplifier 130 may include an inverting amplifier. As a voltage level of the amplified detection signal ADT increases, a voltage level of the difference signal DF may decrease. When the voltage level of the difference signal DF is lower than the ON reference value, the ON comparator 141 may output the ON event signal ON indicating that the intensity of light incident onto the photo detector 110 increases.

In an exemplary embodiment, when the intensity of light incident onto the photo detector 110 decreases over the reference interval, the OFF comparator 142 may determine the OFF event to output the OFF event signal OFF. In detail, the differencing amplifier 130 may include an inverting amplifier. As a voltage level of the amplified detection signal ADT decreases, a voltage level of the difference signal DF may increase. When the voltage level of the difference signal DF is greater than the OFF reference value, the OFF comparator 142 may output the OFF event signal OFF indicating that the intensity of light incident onto the photo detector 110 decreases.

The output logic circuit 150 may receive the ON event signal ON or the OFF event signal OFF from the event determination circuit 140. The output logic circuit 150 may output the reset signal RST to the differencing amplifier 130 in response to the ON event signal ON or the OFF event signal OFF. A voltage level of the difference signal DF that is output from the differencing amplifier 130 receiving the reset signal RST may be set to the reset voltage.

Figure 3:
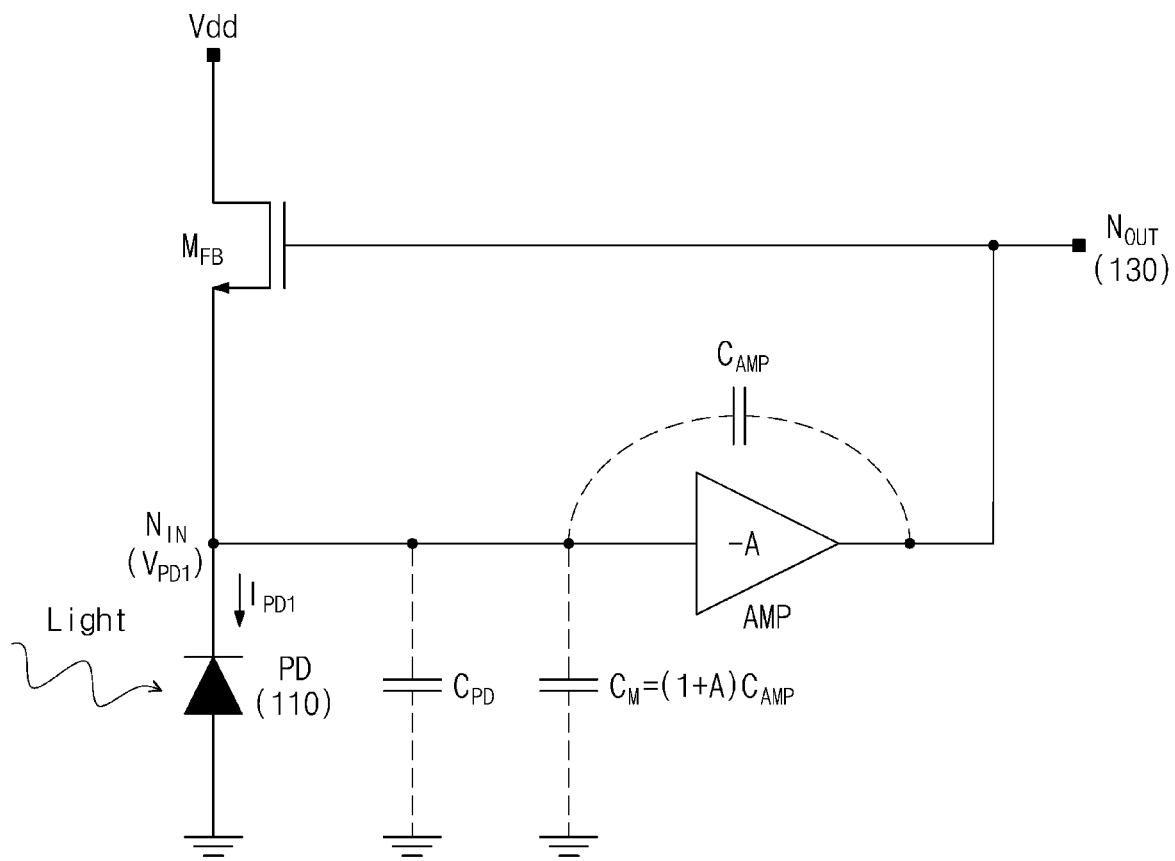
FIG. 3 is a circuit diagram illustrating a log amplifier.

FIG. 3 is a circuit diagram illustrating a log amplifier. A circuit diagram of a log amplifier LA is illustrated in FIG. 3. The log amplifier LA may receive a detection signal from the photo detector 110 through an input node $N_{IN}$. The log amplifier LA may amplify the detection signal and may output the amplified detection signal to the differencing amplifier 130 through an output node $N_{OUT}$.

An amplifier AMP may be connected between the input node $N_{IN}$ and the output node $N_{OUT}$. The amplifier AMP may amplify the detection signal received through the input node $N_{IN}$ and may output the amplified detection signal to the output node $N_{OUT}$. For example, the amplifier AMP may be an inverting amplifier having an amplification gain "A".

A feedback transistor $M_{FB}$ may be connected between a power supply voltage Vdd and the input node $N_{IN}$. The feedback transistor $M_{FB}$ may operate in response to a voltage of the output node $N_{OUT}$. For example, the feedback transistor $M_{FB}$ may be an NMOS transistor that includes a source node connected with the input node $N_{IN}$, a gate node connected with the output node $N_{OUT}$, and a drain node connected with the power supply voltage Vdd.

In an exemplary embodiment, as a parasitic capacitance of the input node $N_{IN}$ increases, an operating speed of the log amplifier LA may decrease. The operating speed may mean a speed at which a voltage of the output node $N_{OUT}$ varies in response to a charge change of the input node $N_{IN}$. Because a charge amount is expressed by a product of a capacitance and a voltage, when the amount of change of charges is uniform at the input node $N_{IN}$, a speed at which a voltage $V_{PD1}$ of the input node $N_{IN}$ varies may decrease as the parasitic capacitance becomes greater.

The parasitic capacitance of the input node $N_{IN}$ may include a parasitic capacitance $C_{PD}$ of a photo detector and a Miller capacitance $C_M$ of an amplifier. The parasitic capacitance $C_{PD}$ of a photo detector may mean a parasitic capacitance by the photo detector 110. The parasitic capacitance $C_{PD}$ of a photo detector may be determined by a size of the photo detector 110. Because the area in which light is received becomes smaller as the size of the photo detector 110 decreases, there is a limitation on reducing the parasitic capacitance $C_{PD}$ of a photo detector.

The Miller capacitance $C_M$ may mean that the parasitic capacitance $C_{AMP}$ of the amplifier AMP is amplified by the Miller effect. The Miller effect may mean an effect by which a capacitance between an input terminal and an output terminal is amplified. For example, in the case where the parasitic capacitance $C_{AMP}$ is present between an input terminal and an output terminal of the amplifier AMP, an equivalent capacitance at the input terminal of the amplifier AMP may be the Miller capacitance $C_M$. In this case, a value of the Miller capacitance $C_M$ may be a value that is obtained by multiplying the parasitic capacitance $C_{AMP}$ and a value, which is obtained by adding "1" and the amplification gain "A", together.

In an exemplary embodiment, an operating speed of the log amplifier LA may be low in a low-illuminance environment. For example, the photo detector 110 may generate a current $I_{PD1}$ that is proportional to the intensity of an incident light. The intensity of the current $I_{PD1}$ that is generated from the photo detector 110 in the low-illuminance environment may be weak. Because a charge amount is expressed by a product of a capacitance and a voltage, a speed at which the voltage $V_{PD1}$ of the input node $N_{IN}$ varies may decrease as the intensity of the current $I_{PD1}$ becomes weaker. As such, a speed at which a voltage of the output node $N_{OUT}$ varies may decrease.

As described above, the operating speed of the log amplifier LA may have an influence of the parasitic capacitance of the input node $N_{IN}$ and the intensity of the current $I_{PD1}$ generated from the photo detector 110. As such, a way to decrease the parasitic capacitance or a way to increase the intensity of the current $I_{PD1}$ generated from the photo detector 110 may be required to improve the operating speed of the log amplifier LA in the low-illuminance environment.

Figure 4:
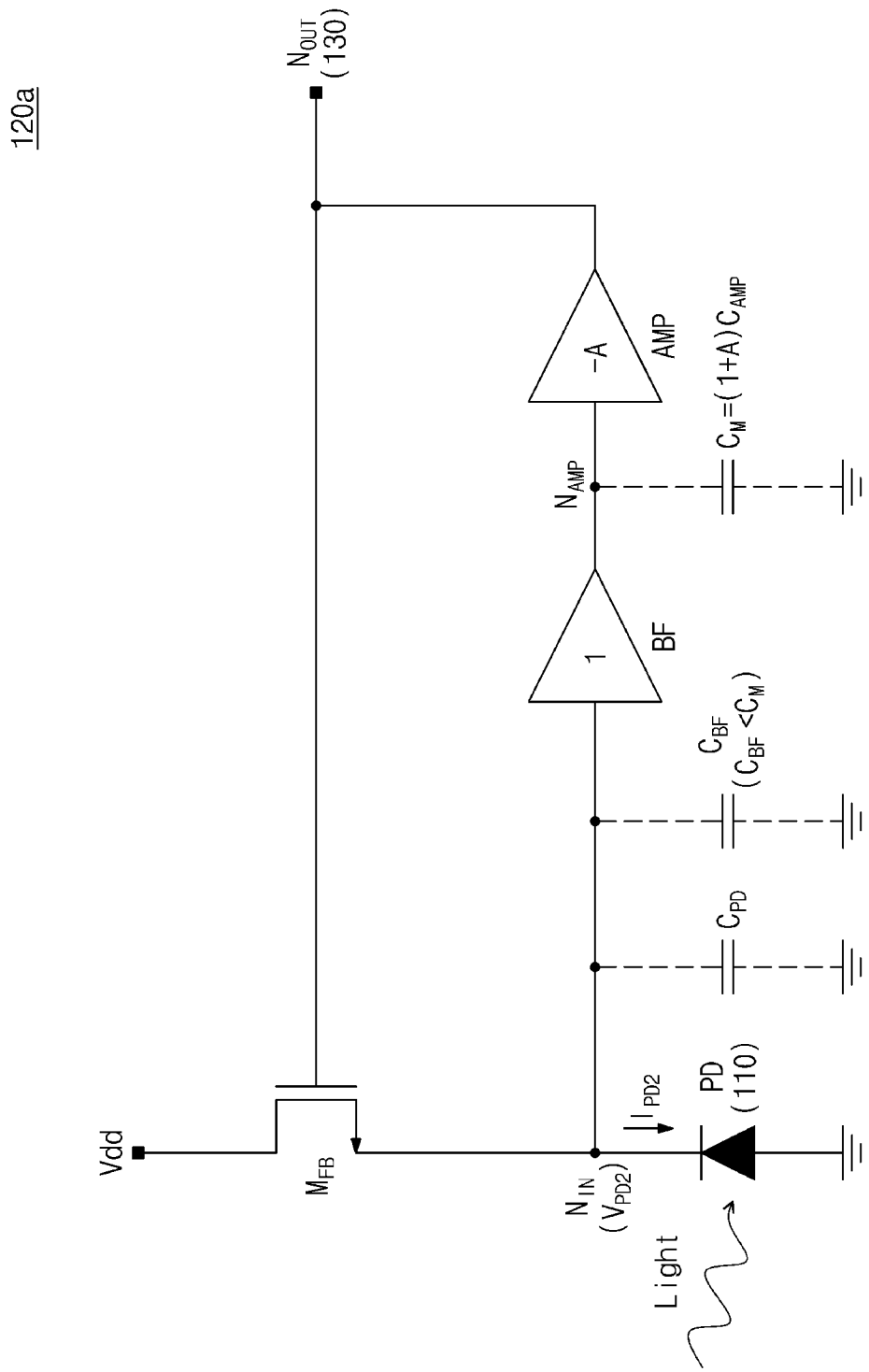
FIG. 4 is a circuit diagram illustrating a log amplifier including a buffer.

FIG. 4 is a circuit diagram illustrating a log amplifier including a buffer. Referring to FIG. 4, a circuit diagram of a log amplifier 120a including a buffer BF is illustrated in FIG. 4. Characteristics of the amplifier AMP and the feedback transistor $M_{FB}$ of the log amplifier 120a are described with reference to FIG. 3, and thus, additional description will be omitted to avoid redundancy.

The buffer BF may be connected between the input node $N_{IN}$ and an amplification node $N_{AMP}$. The buffer BF may transfer a detection signal received through the input node $N_{IN}$ to the amplification node $N_{AMP}$. The amplifier AMP may amplify the detection signal received through the amplification node $N_{AMP}$ and may output the amplified detection signal to the output node $N_{OUT}$. That is, the buffer BF may be a circuit that separates the input node $N_{IN}$, at which charges generated by the photo detector 110 are integrated, from the amplification node $N_{AMP}$ connected with an input terminal of the amplifier AMP.

In an exemplary embodiment, a parasitic capacitance of the input node $N_{IN}$ in the log amplifier 120a including the buffer BF may be smaller than a parasitic capacitance of an input node in a log amplifier (e.g., the log amplifier LA of FIG. 3) not including a buffer. For example, an amplification gain of the buffer BF may be smaller than an amplification gain of the amplifier AMP and may be "1." A parasitic capacitance $C_{BF}$ of the buffer BF may be smaller than the Miller capacitance $C_M$ of the amplifier AMP. As the parasitic capacitance of the input node $N_{IN}$ decreases, an operating speed of the log amplifier 120a may increase.

In an exemplary embodiment, a voltage $V_{PD2}$ of the input node $N_{IN}$ in the log amplifier 120a including the buffer BF may be greater than a voltage of the input node in the log amplifier (e.g., the log amplifier LA of FIG. 3) not including a buffer. In detail, as a reverse bias voltage of the photo detector 110 increases, the intensity of a current $I_{PD2}$ generated from the photo detector 110 may increase. As the intensity of the current $I_{PD2}$ increases, an operating speed of the log amplifier 120a may increase. This will be more fully described with reference to FIGS. 6A, 6B, and 7 together.

As described above, according to an embodiment of the disclosure, as the buffer BF is added, the parasitic capacitance of the input node $N_{IN}$ may decrease, and the voltage $V_{PD2}$ of the input node $N_{IN}$ may increase. This means that the operating speed of the log amplifier 120a is improved.

Figure 5:
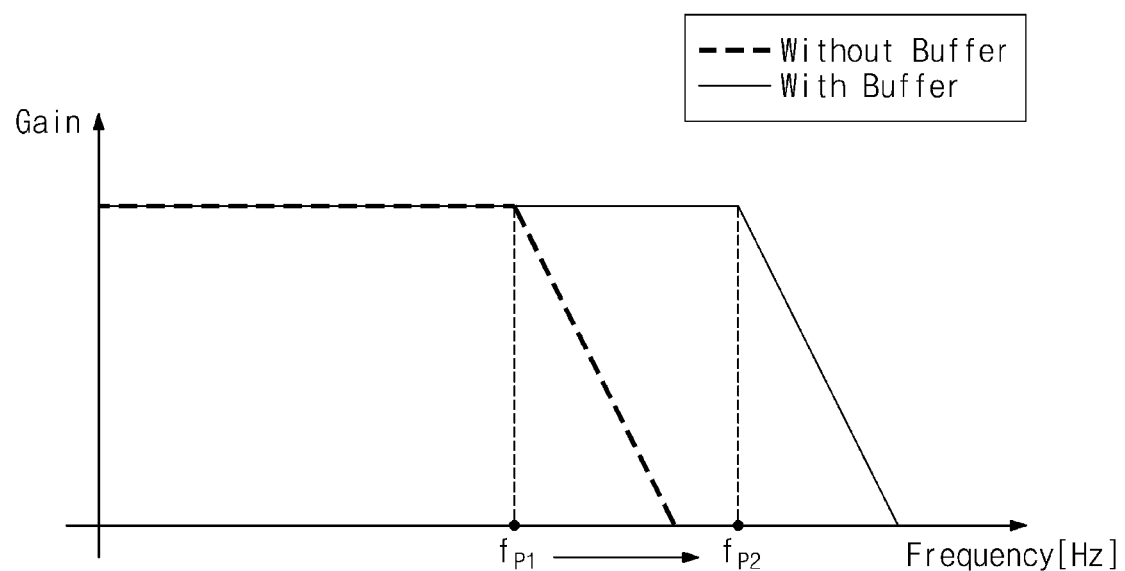
FIG. 5 is a graph illustrating an operating band of log amplifiers of FIGS. 3 and 4.

FIG. 5 is a graph illustrating an operating band of log amplifiers of FIGS. 3 and 4. Referring to FIGS. 3 to 5, a dashed line indicates an operating band according to a frequency of the log amplifier LA not including a buffer. Also, a solid line indicates an operating band according to a frequency of the log amplifier 120a including the buffer BF.

According to an embodiment of the disclosure, a dominant pole $f_{p2}$ of the log amplifier 120a including the buffer BF may be higher in frequency than a dominant pole $f_{p1}$ of the log amplifier LA. The dominant pole may be referred to as a "first pole" and may be used to identify an operating band of a log amplifier. A frequency corresponding to the dominant pole may be inversely proportional to a parasitic capacitance of the input node $N_{IN}$. That is, in the case where the log amplifier 120a includes a buffer, a parasitic capacitance of the input node $N_{IN}$ may decrease, and thus, the log amplifier 120a may have a dominant pole of a high frequency. This may mean that an operating band is shifted upwards.

Figure 6A:
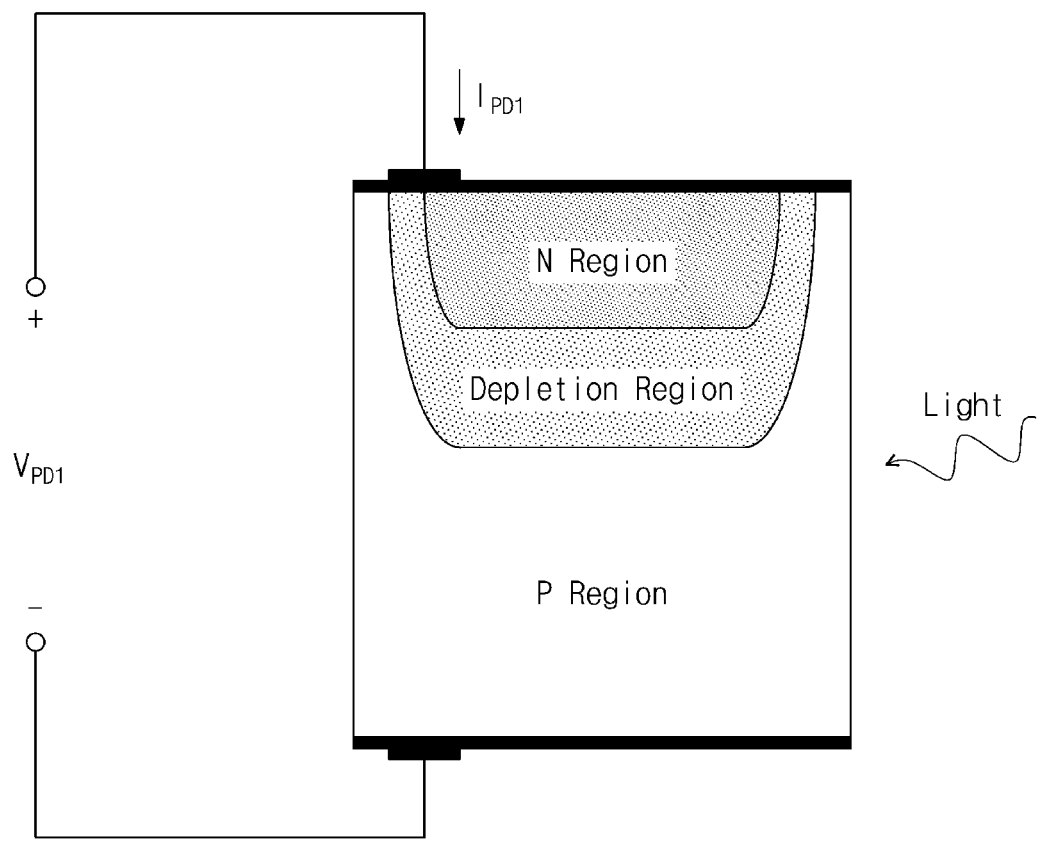
FIG. 6A is a diagram illustrating a photo detector of FIG. 3.

FIG. 6A is a diagram illustrating a photo detector of FIG. 3. Regions of the photo detector 110 included in the log amplifier LA are illustrated in FIG. 6A. The photo detector 110 may include an N region, a P region, and a depletion region. The N region may be a region including an N-type semiconductor material in which electrons are more dominant than holes. The P region may be a region including a P-type semiconductor material in which holes are more dominant than electrons. The depletion region may be a region that is insulated according to a movement of electrons or holes. When receiving light, the photo detector 110 may generate the current $I_{PD1}$.

Figure 6B:
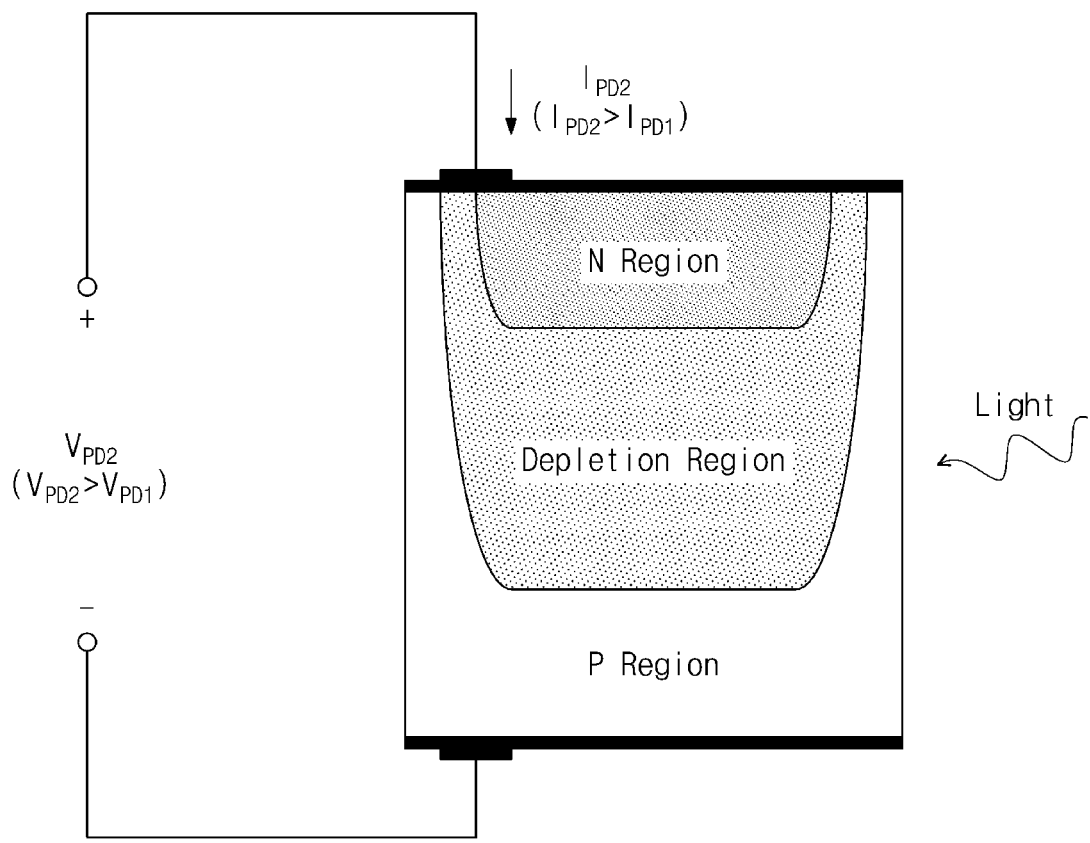
FIG. 6B is a diagram illustrating a photo detector of FIG. 4.

FIG. 6B is a diagram illustrating a photo detector of FIG. 4. An N region, a P region, and a depletion region of the photo detector 110 included in the log amplifier 120a including the buffer BF are illustrated in FIG. 6B.

According to an embodiment of the disclosure, as a reverse bias voltage of the photo detector 110 increases, the depletion region may become wider; as the depletion region becomes wider, a magnitude of a current generated at the photo detector 110 may increase. For example, the voltage $V_{PD2}$ may be greater than the voltage $V_{PD1}$ of FIG. 6A. The depletion region may be wider than the depletion region of FIG. 6A. The current $I_{PD2}$ generated based on a wide depletion region may be greater in intensity than the current $I_{PD1}$ generated based on a narrow depletion region of FIG. 6A.

Figure 7:
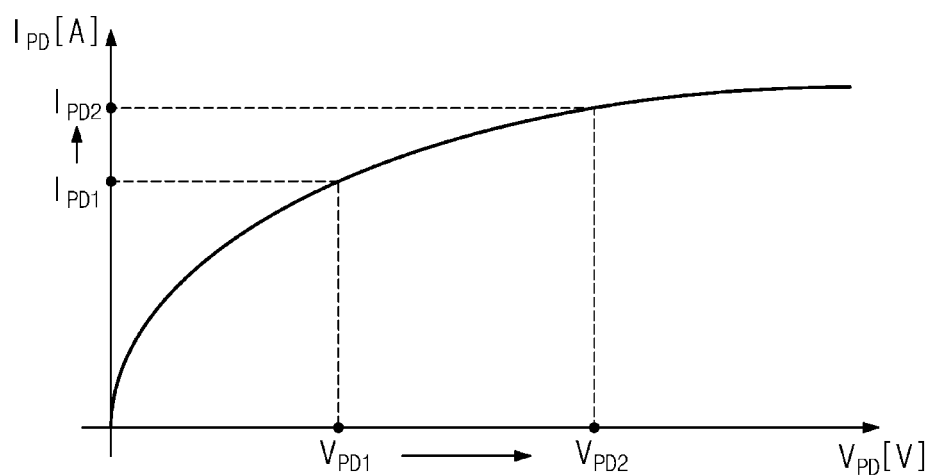
FIG. 7 is a graph illustrating an output characteristic of a photo detector of FIGS. 3 and 4.

FIG. 7 is a graph illustrating an output characteristic of a photo detector of FIGS. 3 and 4. A relationship between a reverse bias voltage of a photo detector and a current generated at the photo detector under the condition that the intensity of an incident light is uniform is illustrated in FIG. 7. When a reverse bias voltage of a photo detector increases from the voltage $V_{PD1}$ to the voltage $V_{PD2}$, the depletion region of the photo detector may become wider. As the depletion region becomes wider, a current generated at the photo detector may increase from the current $I_{PD1}$ to the current $I_{PD2}$. That is, as the reverse bias voltage of the photo detector increases, a photoelectric conversion efficiency may increase.

Meanwhile, unlike the example illustrated in FIG. 7, even though the reverse bias voltage of the photo detector is uniformly maintained at the voltage $V_{PD1}$, a current that is proportional to the intensity of light incident onto the photo detector may be generated at the photo detector. For example, when the amount of light incident onto the photo detector to which the reverse bias voltage of the voltage $V_{PD1}$ is applied increases, the current $I_{PD2}$ may be generated at the photo detector. When the amount of light incident onto the photo detector to which the reverse bias voltage of the voltage $V_{PD1}$ is applied decreases, a current that is smaller in amount than the current $I_{PD1}$ may be generated at the photo detector.

Figure 8:
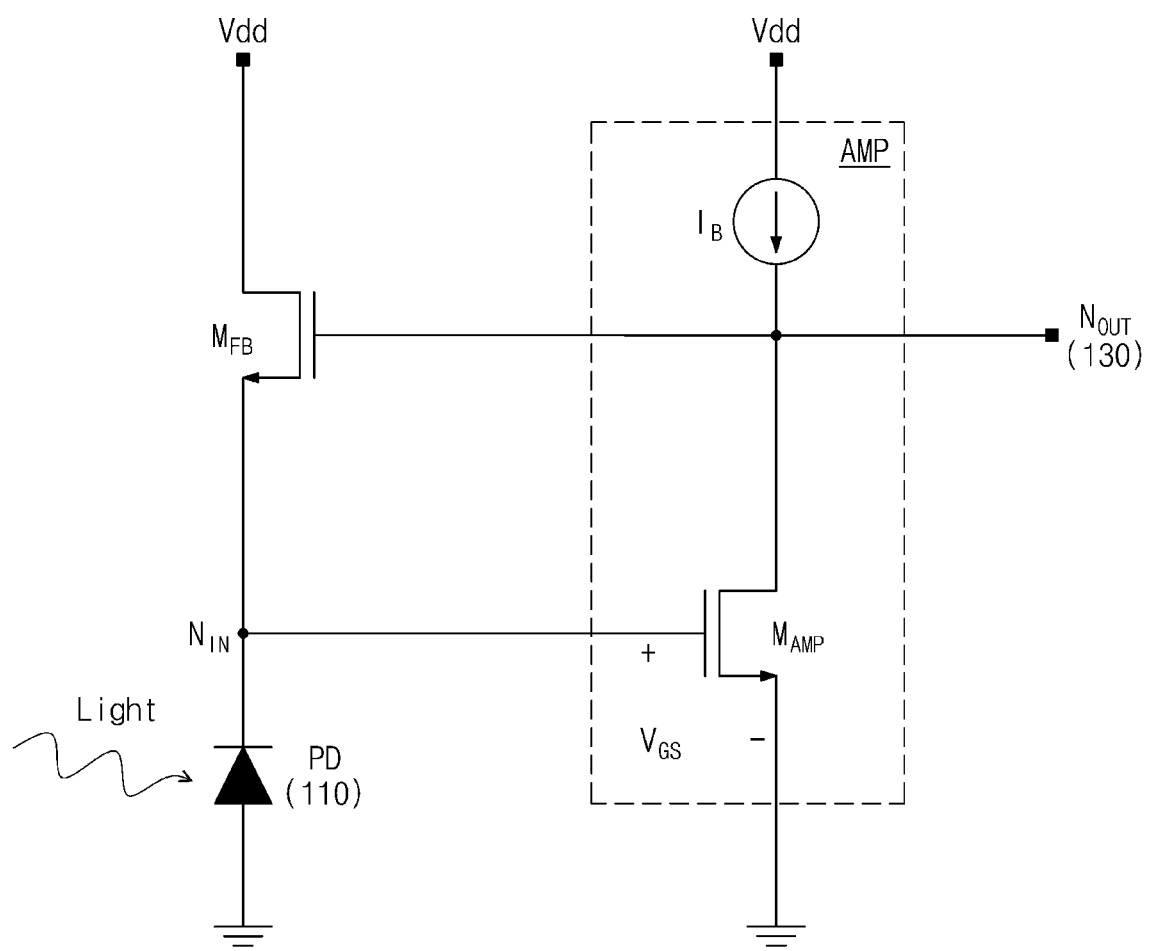
FIG. 8 is a circuit diagram illustrating a log amplifier of FIG. 3.

FIG. 8 is a circuit diagram illustrating a log amplifier of FIG. 3. The log amplifier LA in which the amplifier AMP is implemented in a transistor level is illustrated in FIG. 8. Characteristics of the photo detector 110 and the feedback transistor $M_{FB}$ are similar to the characteristics of the photo detector 110 and the feedback transistor $M_{FB}$ of FIG. 3, and thus, additional description will be omitted to avoid redundancy.

The amplifier AMP may include an amplification transistor $M_{AMP}$ and a current bias $I_B$. The current bias $I_B$ may be connected between the power node Vdd and the output node $N_{OUT}$. The amplification transistor $M_{AMP}$ may be connected between the output node $M_{AMP}$ and a ground node. The amplification transistor $M_{AMP}$ may operate in response to a voltage of the input node $N_{IN}$. The amplification transistor $M_{AMP}$ may operate in a sub-threshold region in which a drain current according to a gate voltage increases in proportion to a log scale.

For example, the amplification transistor $M_{AMP}$ may be an NMOS transistor that includes a source node connected with the ground node, a gate node connected with the input node $N_{IN}$, and a drain node connected with the output node $N_{OUT}$.

In an exemplary embodiment, a reverse bias voltage of the photo detector 110 may be limited by the amplification transistor $M_{AMP}$. In detail, the reverse bias voltage of the photo detector 110 may be a voltage of the input node $N_{IN}$. The voltage of the input node $N_{IN}$ may be a gate-source voltage $V_{GS}$ of the amplification transistor $M_{AMP}$. For example, the gate-source voltage $V_{GS}$ may be 400 mV.

That is, a voltage of the input node $N_{IN}$ of the log amplifier LA may be limited to the gate-source voltage $V_{GS}$. As such, the reverse bias voltage of the photo detector 110 in the log amplifier LA may decrease.

Figure 9:
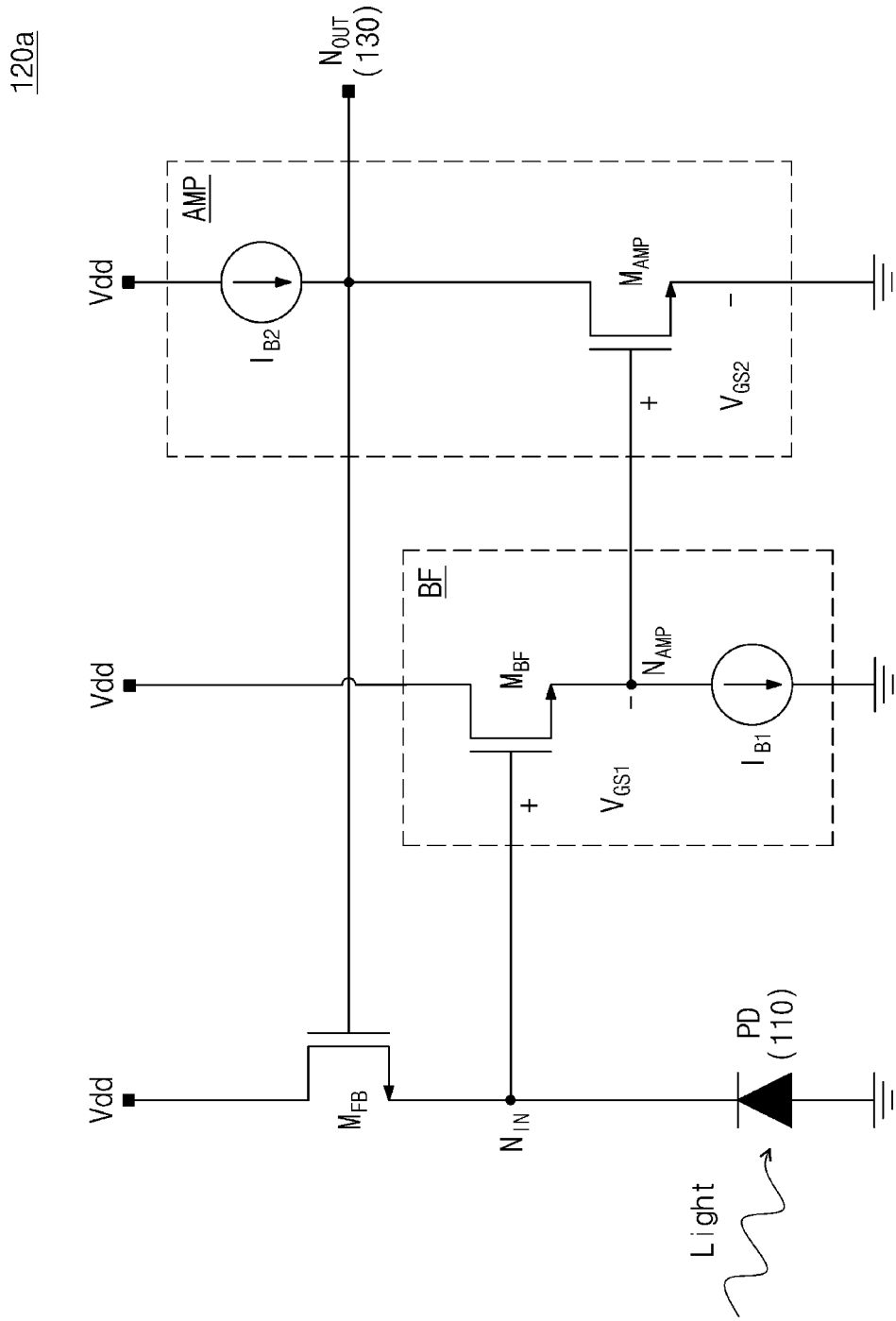
FIG. 9 is a circuit diagram illustrating a log amplifier of FIG. 4.

FIG. 9 is a circuit diagram illustrating a log amplifier of FIG. 4. The log amplifier 120a in which the buffer BF and the amplifier AMP are implemented in a transistor level is illustrated in FIG. 9. Characteristics of the photo detector 110 and the feedback transistor $M_{FB}$ are similar to the characteristics of the photo detector 110 and the feedback transistor $M_{FB}$ of FIG. 3, and thus, additional description will be omitted to avoid redundancy.

The buffer BF may include a buffer transistor $M_{BF}$ and a first current bias $I_{B1}$. The first current bias $I_{B1}$ may supply a bias power to the buffer transistor $M_{BF}$. The buffer transistor $M_{BF}$ may be connected between the power node Vdd and an amplification node $N_{AMP}$. The buffer transistor $M_{BF}$ may operate in response to a voltage of the input node $N_{IN}$. The buffer transistor $M_{BF}$ may operate in a sub-threshold region.

In an exemplary embodiment, the buffer BF may be implemented based on an NMOS transistor. For example, the first current bias Li may be connected between the amplification node $N_{AMP}$ and the ground node. The buffer transistor $M_{BF}$ may be an NMOS transistor that includes a source node connected with the amplification node $N_{AMP}$, a gate node connected with the input node $N_{IN}$, and a drain node connected with the power node Vdd.

The amplifier AMP may include the amplification transistor $M_{AMP}$ and a second current bias $I_{B2}$. The second current bias $I_{B2}$ may supply a bias power to the amplification transistor $M_{AMP}$. The amplification transistor $M_{AMP}$ may be connected between the output node $N_{OUT}$ and the ground node. The amplification transistor $M_{AMP}$ may operate in response to a voltage of the amplification node $N_{AMP}$. The amplification transistor $M_{AMP}$ may operate in a sub-threshold region.

In an exemplary embodiment, the amplifier AMP may be implemented based on an NMOS transistor. For example, the second current bias $I_{B2}$ may be connected between the power node Vdd and the output node $N_{OUT}$. The amplification transistor $M_{AMP}$ may be an NMOS transistor that includes a source node connected with the ground node, a gate node connected with the amplification node $N_{AMP}$, and a drain node connected with the output node $N_{OUT}$.

In an exemplary embodiment, a reverse bias voltage of the photo detector 110 in the log amplifier 120a including the buffer BF based on an NMOS transistor may be higher than that in a log amplifier not including a buffer. The reverse bias voltage of the photo detector 110 may be a voltage of the input node $N_{IN}$. The voltage of the input node $N_{IN}$ may be a voltage that is obtained by adding a first gate-source voltage $V_{GS1}$ of the buffer transistor $M_{BF}$ and a second gate-source voltage $V_{GS2}$ of the amplification transistor $M_{AMP}$. That is, as the buffer BF is added, the voltage of the input node $N_{IN}$ may be further increased as much as the first gate-source voltage $V_{GS1}$.

For example, the first gate-source voltage $V_{GS1}$ may be 400 mV. The second gate-source voltage $V_{GS2}$ may be 400 mV. The voltage of the input node $N_{IN}$ may be 800 mV.

Figure 10:
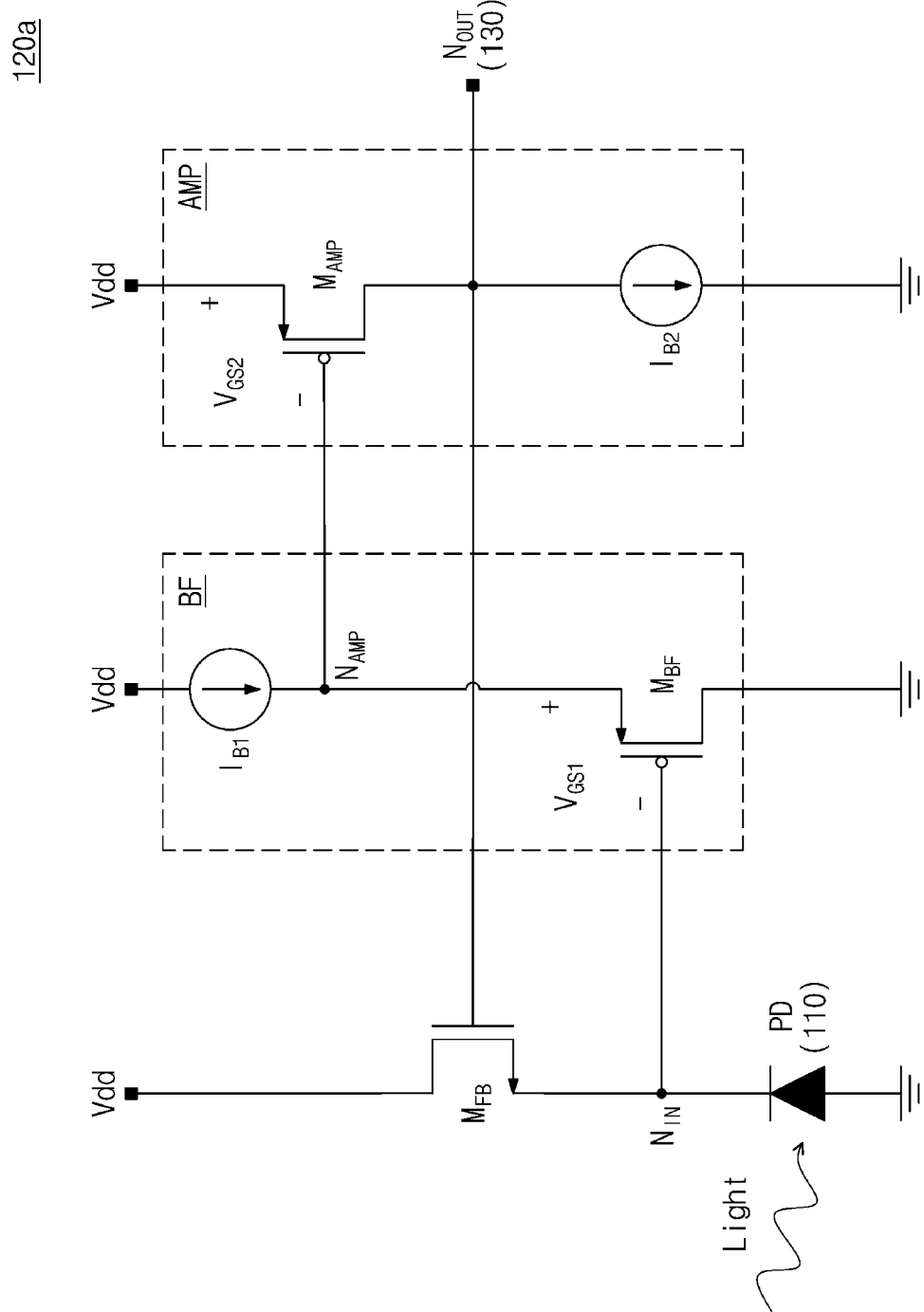
FIG. 10 is a circuit diagram illustrating a log amplifier of FIG. 4.

FIG. 10 is a circuit diagram illustrating a log amplifier of FIG. 4. The log amplifier 120a in which the buffer BF and the amplifier AMP are implemented in a transistor level is illustrated in FIG. 10. A connection relationship between the photo detector 110, the feedback transistor $M_{FB}$, the buffer BF, and the amplifier AMP are described with reference to FIG. 9, and thus, additional description will be omitted to avoid redundancy.

In an exemplary embodiment, the buffer BF may be implemented based on a PMOS transistor. For example, the first current bias $I_{B1}$ may be connected between the power node Vdd and the amplification node $N_{AMP}$. The buffer transistor $M_{BF}$ may be a PMOS transistor that includes a source node connected with the amplification node $N_{AMP}$, a gate node connected with the input node $N_{IN}$, and a drain node connected with the ground node.

In an exemplary embodiment, the amplifier AMP may be implemented based on a PMOS transistor. For example, the second current bias $I_{B2}$ may be connected between the output node $N_{OUT}$ and the ground node. The amplification transistor $M_{AMP}$ may be a PMOS transistor that includes a source node connected with the power node Vdd, a gate node connected with the amplification node $N_{AMP}$, and a drain node connected with the output node $N_{OUT}$.

In an exemplary embodiment, a reverse bias voltage of the photo detector 110 in the log amplifier 120a including the buffer BF based on a PMOS transistor may be higher than that in a log amplifier not including a buffer. The reverse bias voltage of the photo detector 110 may be a voltage of the input node $N_{IN}$. The voltage of the input node $N_{IN}$ may be a voltage that is obtained by subtracting the second gate-source voltage $V_{GS2}$ of the amplification transistor $M_{AMP}$ and the first gate-source voltage $V_{GS1}$ of the buffer transistor $M_{BF}$ from a voltage of the power node Vdd. That is, as the buffer BF is added, the voltage of the input node $N_{IN}$ may be increased.

For example, the voltage of the power node Vdd may be 2.8 V. The first gate-source voltage $V_{GS1}$ may be 400 mV. The second gate-source voltage $V_{GS2}$ may be 400 mV. The voltage of the input node $N_{IN}$ may be 2 V.

Figure 11:
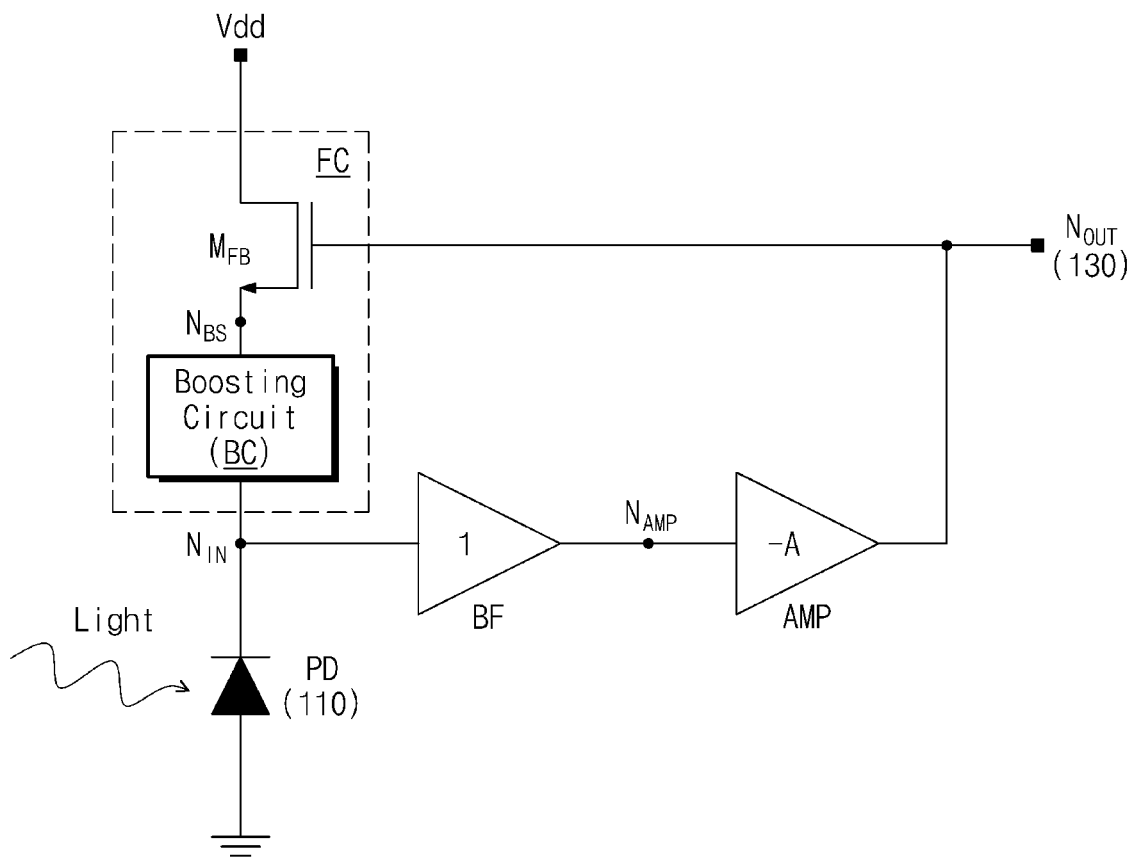
FIG. 11 is a circuit diagram illustrating a log amplifier including a buffer and a feedback circuit.

FIG. 11 is a circuit diagram illustrating a log amplifier including a buffer and a feedback circuit. A circuit diagram of a log amplifier 120b including the buffer BF and a feedback circuit FC is illustrated in FIG. 11. Characteristics of the buffer BF and the amplifier AMP of the log amplifier 120b are similar to the characteristics of the buffer BF and the amplifier AMP of the log amplifier 120a of FIG. 4, and thus, additional description will be omitted to avoid redundancy.

The feedback circuit FC may include the feedback transistor $M_{FB}$ and a boosting circuit BC. The boosting circuit BC may be a circuit configured to amplify a signal of an input terminal and to output the amplified signal to an output terminal. For example, the boosting circuit BC may amplify a signal of a boosting node $N_{BS}$ and may output the amplified signal to the input node $N_{IN}$. That is, the feedback circuit FC may be a circuit that is connected between the output node $N_{OUT}$ and the input node $N_{IN}$ and is configured to amplify a voltage of the output node $N_{OUT}$ and to output the amplified voltage to the input node $N_{IN}$.

In an exemplary embodiment, the feedback transistor $M_{FB}$ included in the feedback circuit FC may be an NMOS transistor. For example, the feedback transistor $M_{FB}$ may be an NMOS transistor that is connected between the power node Vdd and the boosting node $N_{BS}$ and is configured to operate in response to a voltage of the output node $N_{OUT}$. The boosting circuit BC may be a circuit that is connected between the boosting node $N_{BS}$ and the input node $N_{IN}$ and is configured to amplify a voltage of the boosting node $N_{BS}$ and to output the amplified voltage to the input node $N_{IN}$.

As described above, according to an embodiment of the disclosure, as the log amplifier 120b includes the feedback circuit FC configured to amplify a voltage of the output node $N_{OUT}$ and to output the amplified signal to the input node $N_{IN}$, the log amplifier 120b with an improved amplification efficiency may be provided.

Figure 12A:
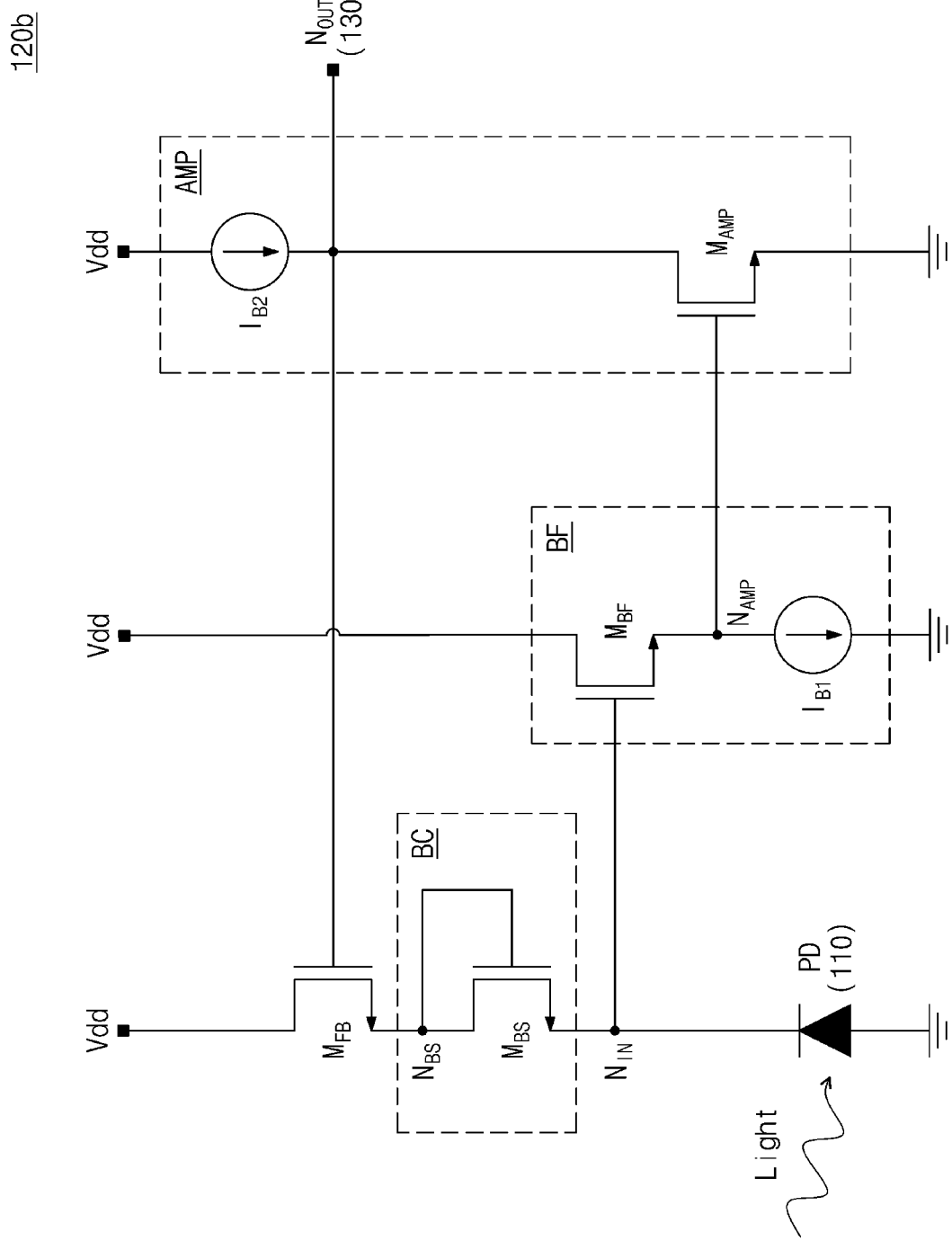
FIGS. 12A to 12C are circuit diagrams illustrating a log amplifier of FIG. 11.
Figure 12B:
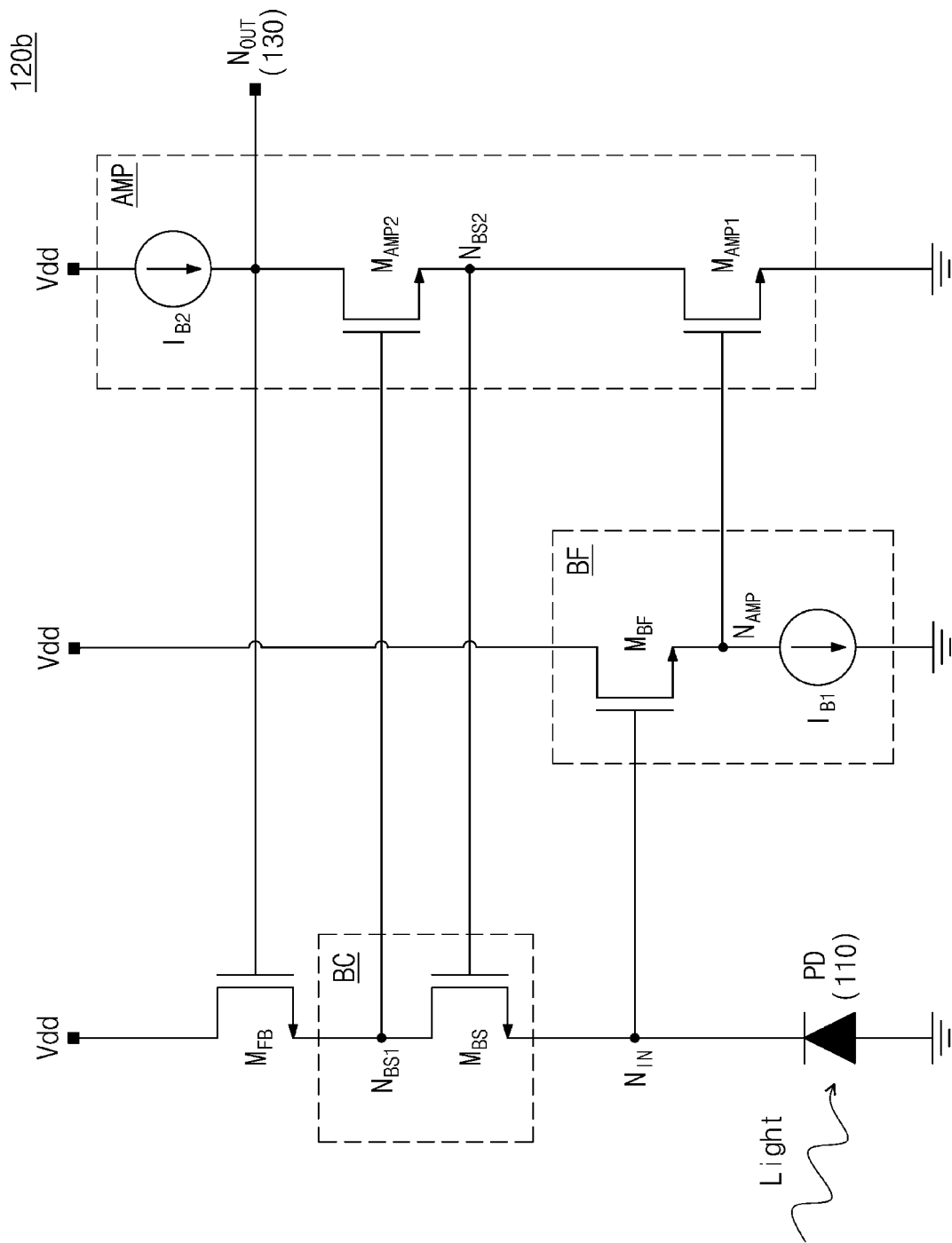
Figure 12C:
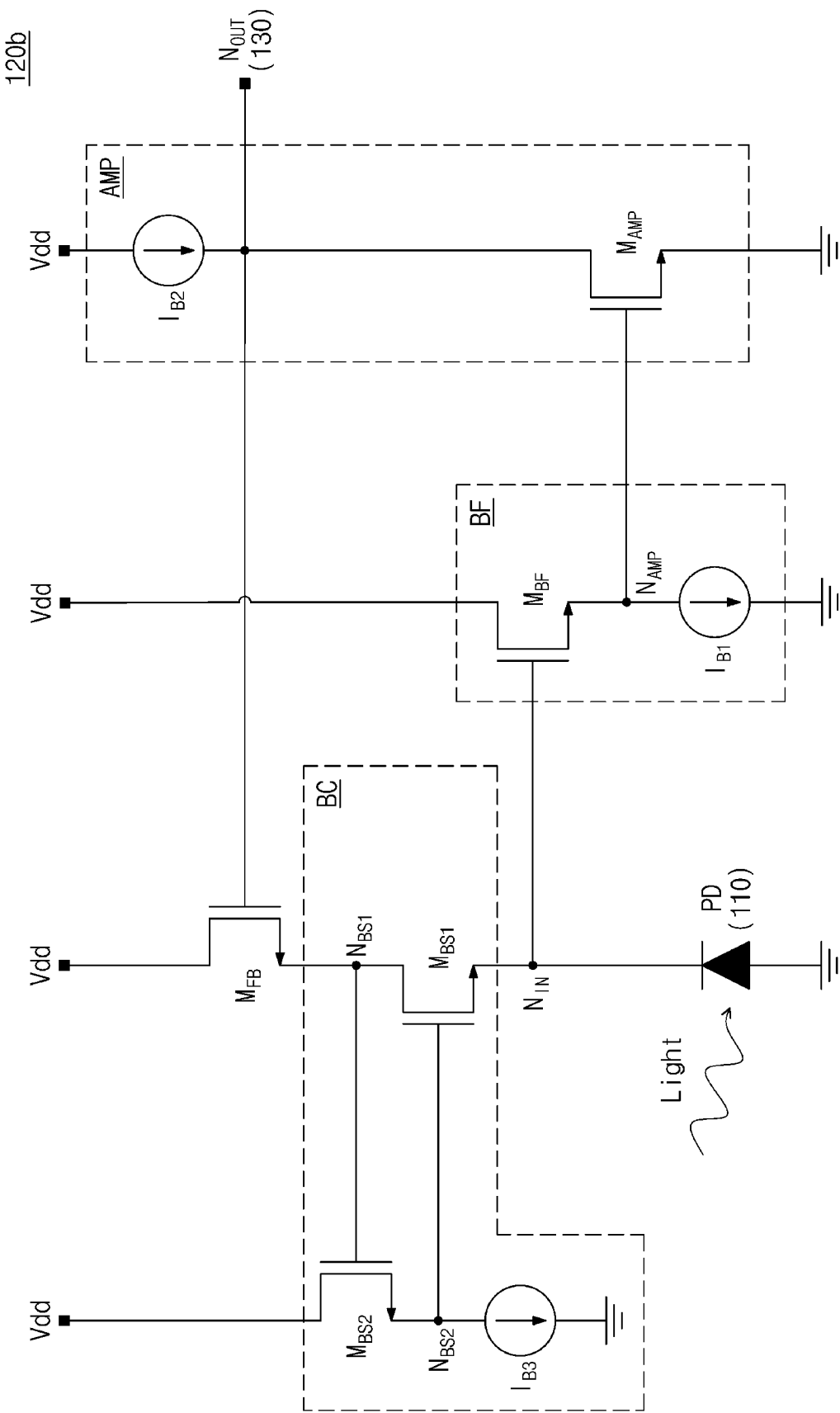

FIGS. 12A to 12C are circuit diagrams illustrating a log amplifier of FIG. 11. The log amplifier 120b in which the boosting circuit BC, the buffer BF, and the amplifier AMP are implemented in a transistor level is illustrated in FIG. 12A. Characteristics of the photo detector 110, the buffer BF, the amplifier AMP, and the feedback transistor $M_{FB}$ are similar to the characteristics of the photo detector 110, the buffer BF, the amplifier AMP, and the feedback transistor $M_{FB}$ of FIG. 9, and thus, additional description will be omitted to avoid redundancy.

The boosting circuit BC may include a boosting transistor $M_{BS}$. The boosting transistor $M_{BS}$ may be connected between the boosting node $N_{BS}$ and the input node $N_{IN}$. The boosting transistor $M_{BS}$ may operate in response to a voltage of the boosting node $N_{BS}$. For example, the boosting transistor $M_{BS}$ may be an NMOS transistor that includes a source node connected with the input node $N_{IN}$, a gate node connected with the boosting node $N_{BS}$, and a drain node connected with the boosting node $N_{BS}$.

The log amplifier 120b in which the boosting circuit BC, the buffer BF, and the amplifier AMP are implemented in a transistor level is illustrated in FIG. 12B. The amplifier AMP of FIG. 12B may include a plurality of transistors $M_{AMP1}$ and $M_{AMP2}$. Characteristics of the photo detector 110, the buffer BF, and the feedback transistor $M_{FB}$ are similar to the characteristics of the photo detector 110, the buffer BF, and the feedback transistor $M_{FB}$ of FIG. 9, and thus, additional description will be omitted to avoid redundancy.

The boosting circuit BC may include the boosting transistor $M_{BS}$. The boosting transistor $M_{BS}$ may be connected between a first boosting node $N_{BS1}$ and the input node $N_{IN}$. The boosting transistor $M_{BS}$ may operate in response to a voltage of a second boosting node $N_{BS2}$. For example, the boosting transistor $M_{BS}$ may be an NMOS transistor that includes a source node connected with the input node $N_{IN}$, a gate node connected with the second boosting node $N_{BS2}$, and a drain node connected with the first boosting node $N_{BS1}$.

The amplifier AMP may include the second current bias $I_{B2}$ connected with the output node $N_{OUT}$. The amplifier AMP may include the first and second amplification transistors $M_{AMP1}$ and $M_{AMP2}$. The first amplification transistor $M_{AMP1}$ may be connected between the second boosting node $N_{BS2}$ and the ground node. The first amplification transistor $M_{AMP1}$ may operate in response to a voltage of the amplification node $N_{AMP}$. For example, the first amplification transistor $M_{AMP1}$ may be an NMOS transistor that includes a source node connected with the ground node, a gate node connected with the amplification node $N_{AMP}$, and a drain node connected with the second boosting node $N_{BS2}$.

The second amplification transistor $M_{AMP2}$ may be connected between the output node $M_{AMP}$ and the second boosting node $N_{BS2}$. The second amplification transistor $M_{AMP2}$ may operate in response to a voltage of the first boosting node $N_{BS1}$. For example, the second amplification transistor $M_{AMP2}$ may be an NMOS transistor that includes a source node connected with the second boosting node $N_{BS2}$, a gate node connected with the first boosting node $N_{BS1}$, and a drain node connected with the output node $N_{OUT}$.

The log amplifier 120b in which the boosting circuit BC, the buffer BF, and the amplifier AMP are implemented in a transistor level is illustrated in FIG. 12C. The boosting circuit BC of FIG. 12C may include first and second boosting transistors $M_{BS1}$ and $M_{BS2}$. Characteristics of the photo detector 110, the buffer BF, the amplifier AMP, and the feedback transistor $M_{FB}$ are similar to the characteristics of the photo detector 110, the buffer BF, the amplifier AMP, and the feedback transistor $M_{FB}$ of FIG. 9, and thus, additional description will be omitted to avoid redundancy.

The boosting circuit BC may include a third current bias $I_{B3}$ connected with the second boosting node $N_{BS2}$. The boosting circuit BC may include the first and second boosting transistors $M_{BS1}$ and $M_{BS2}$. The first boosting transistor $M_{BS1}$ may be connected between the first boosting node $N_{BS1}$ and the input node $N_{IN}$. The first boosting transistor $M_{BS1}$ may operate in response to a voltage of the second boosting node $N_{BS2}$. For example, the first boosting transistor $M_{BS1}$ may be an NMOS transistor that includes a source node connected with the input node $N_{IN}$, a gate node connected with the second boosting node $N_{BS2}$, and a drain node connected with the first boosting node $N_{BS1}$.

The second boosting transistor $M_{BS2}$ may be connected between the power node Vdd and the second boosting node $N_{BS2}$. The second boosting transistor $M_{BS2}$ may operate in response to a voltage of the first boosting node $N_{BS1}$. For example, the second boosting transistor $M_{BS2}$ may be an NMOS transistor that includes a source node connected with the second boosting node $N_{BS2}$, a gate node connected with the first boosting node $N_{BS1}$, and a drain node connected with the power node Vdd.

Figure 13:
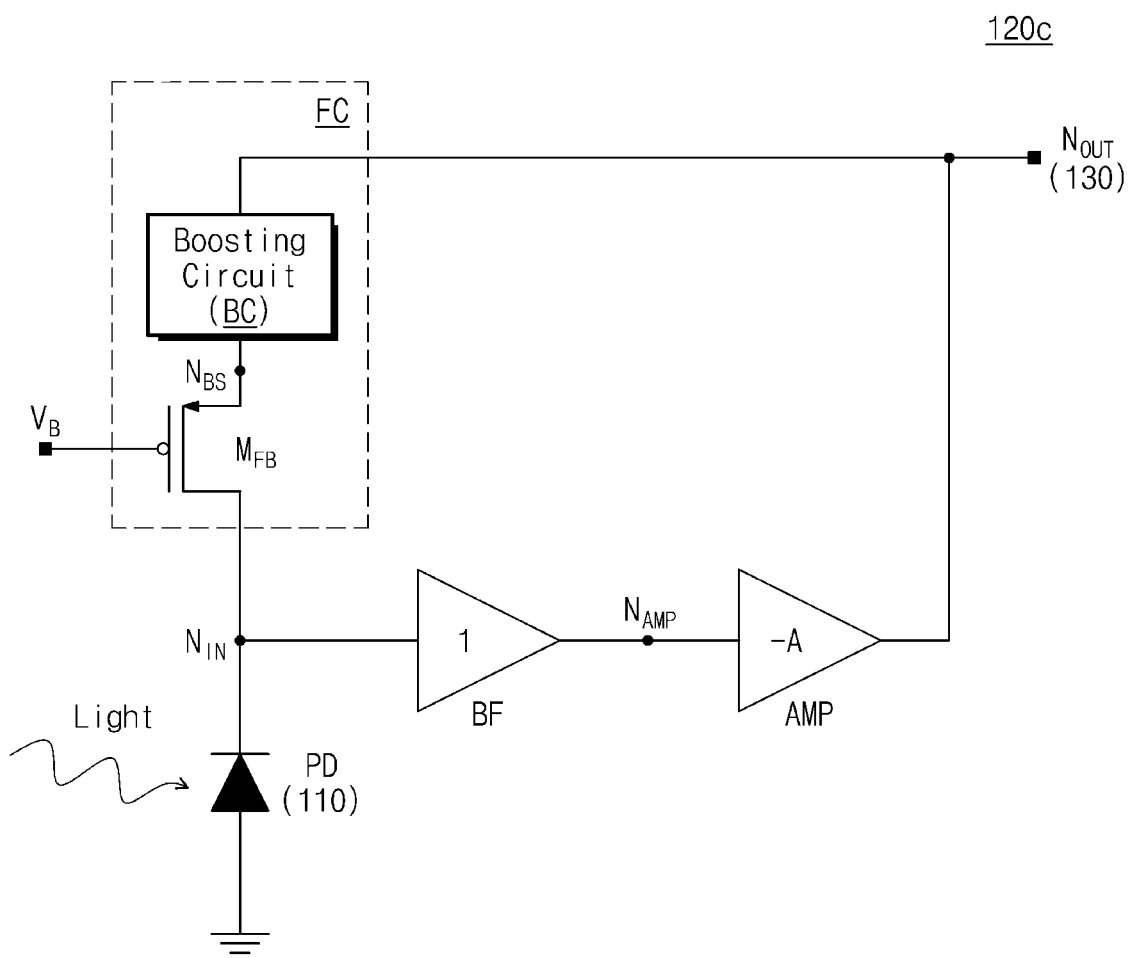
FIG. 13 is a circuit diagram illustrating a log amplifier including a buffer and a feedback circuit.

FIG. 13 is a circuit diagram illustrating a log amplifier including a buffer and a feedback circuit. A circuit diagram of a log amplifier 120c including the buffer BF and the feedback circuit FC is illustrated in FIG. 13. Characteristics of the buffer BF and the amplifier AMP of the log amplifier 120c are similar to the characteristics of the buffer BF and the amplifier AMP of the log amplifier 120a of FIG. 4, and thus, additional description will be omitted to avoid redundancy. The feedback circuit FC may include the feedback transistor $M_{FB}$ and the boosting circuit BC.

In an exemplary embodiment, the feedback transistor $M_{FB}$ included in the feedback circuit FC may be a PMOS transistor. The feedback transistor $M_{FB}$ may be connected between the boosting node $N_{BS}$ and the input node $N_{IN}$ and may be configured to operate in response to a voltage bias $V_B$. For example, the feedback transistor $M_{FB}$ may be a PMOS transistor that includes a source node connected with the boosting node $N_{BS}$, a gate node connected with the voltage bias $V_B$, and a drain node connected with the input node $N_{IN}$.

The boosting circuit BC may be a circuit that is connected between the output node $N_{OUT}$ and the boosting node $N_{BS}$ and is configured to amplify a voltage of the output node $N_{OUT}$ and to output the amplified voltage to the boosting node $N_{BS}$.

Figure 14:
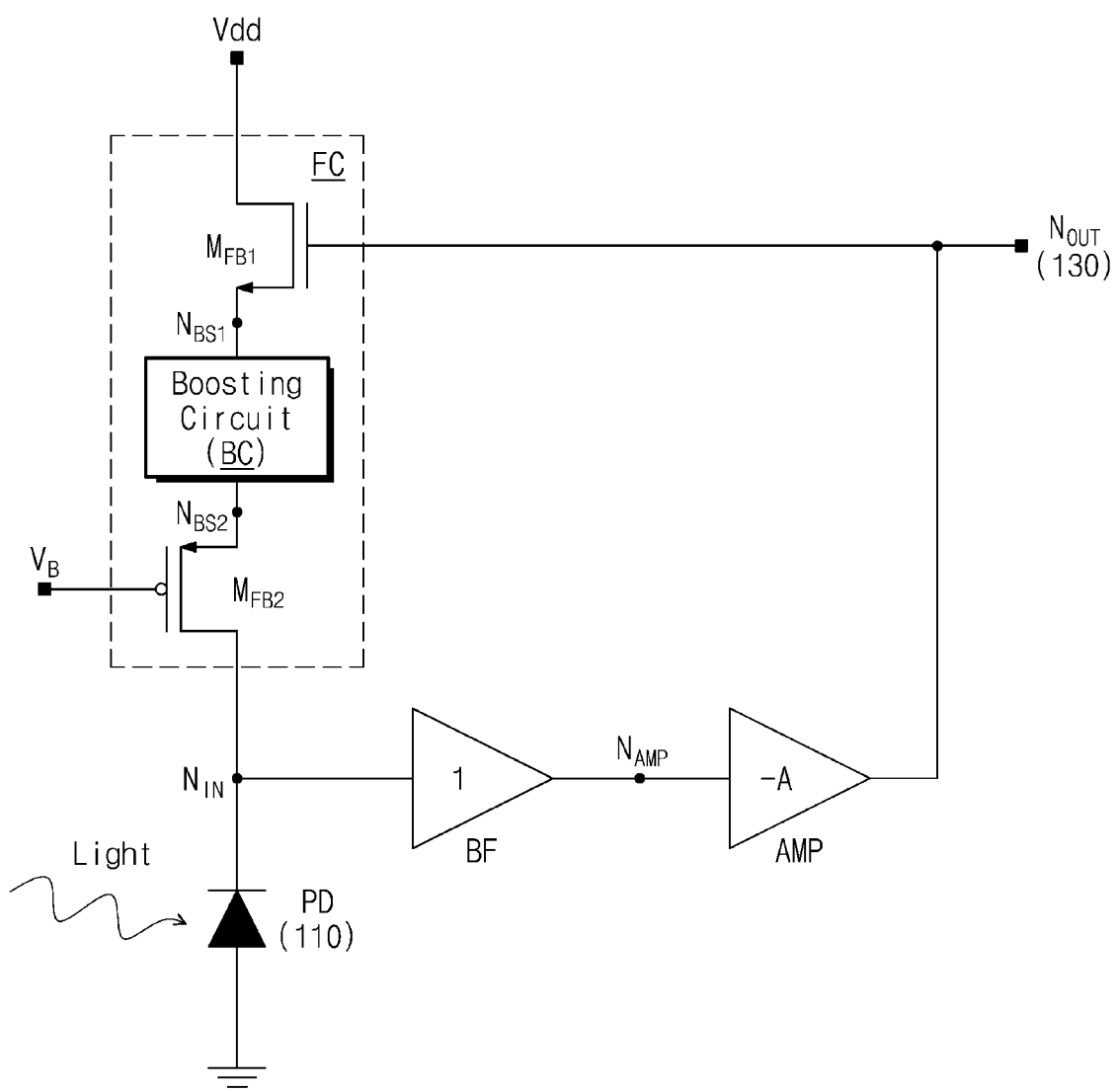
FIG. 14 is a circuit diagram illustrating a log amplifier including a buffer and a feedback circuit.

FIG. 14 is a circuit diagram illustrating a log amplifier including a buffer and a feedback circuit. A circuit diagram of a log amplifier 120d including the buffer BF and the feedback circuit FC is illustrated in FIG. 14. Characteristics of the buffer BF and the amplifier AMP of the log amplifier 120d are similar to the characteristics of the buffer BF and the amplifier AMP of the log amplifier 120a of FIG. 4, and thus, additional description will be omitted to avoid redundancy. The feedback circuit FC may include the first and second feedback transistors $M_{FB1}$ and $M_{FB2}$ and the boosting circuit BC.

In an exemplary embodiment, the first feedback transistor $M_{FB1}$ included in the feedback circuit FC may be an NMOS transistor, and the second feedback transistor $M_{FB2}$ may be a PMOS transistor.

For example, the first feedback transistor $M_{FB1}$ may be an NMOS transistor that is connected between the power node Vdd and the first boosting node $N_{BS1}$ and is configured to operate in response to a voltage of the output node $N_{OUT}$. The first feedback transistor $M_{FB1}$ may include a source node connected with the first boosting node $N_{BS1}$, a gate node connected with the output node $N_{OUT}$, and a drain node connected with the power node Vdd.

For example, the second feedback transistor $M_{FB2}$ may be a PMOS transistor that is connected between the second boosting node $N_{BS2}$ and the input node $N_{IN}$ and is configured to operate in response to the voltage bias $V_B$. For example, the second feedback transistor $M_{FB2}$ may include a source node connected with the second boosting node $N_{BS2}$, a gate node connected with the voltage bias $V_B$, and a drain node connected with the input node $N_{IN}$.

For example, the boosting circuit BC may be a circuit that is connected between the first boosting node $N_{BS1}$ and the second boosting node $N_{BS2}$ and is configured to amplify a voltage of the first boosting node $N_{BS1}$ and to output the amplified voltage to the second boosting node $N_{BS2}$.

Figure 15:
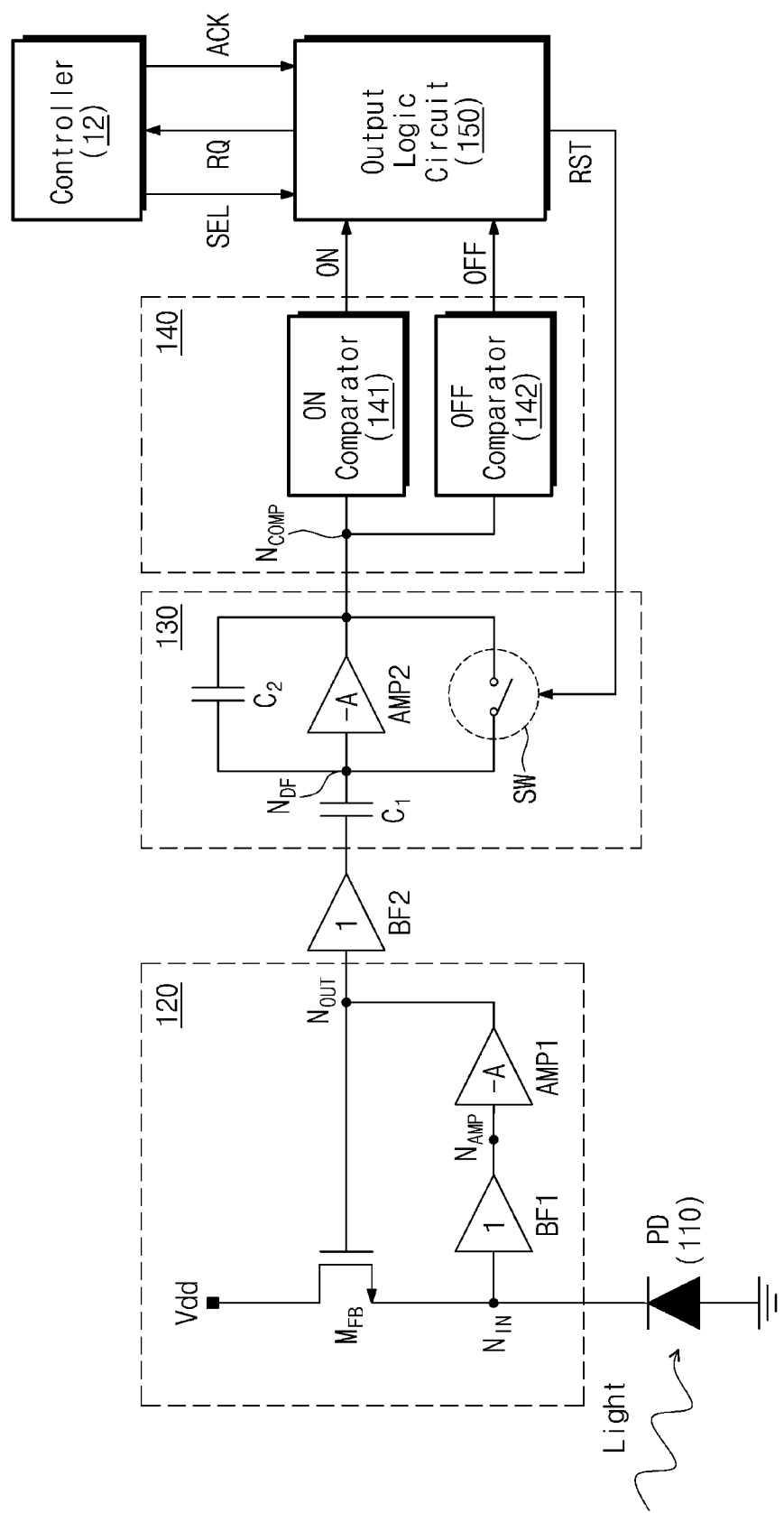
FIG. 15 is a circuit diagram illustrating a pixel circuit of a dynamic vision sensor device according to an embodiment of the disclosure.

FIG. 15 is a circuit diagram illustrating a pixel circuit of a dynamic vision sensor device according to an embodiment of the disclosure. A dynamic vision sensor device according to an embodiment of the disclosure and the controller 12 communicating with the dynamic vision sensor device are illustrated in FIG. 15. The dynamic vision sensor device may include the photo detector 110, the log amplifier 120, the differencing amplifier 130, the event determination circuit 140, and the output logic circuit 150. The controller 12 may communicate with the output logic circuit 150 of the dynamic vision sensor device.

The photo detector 110 may generate a detection signal based on light incident from outside. The photo detector 110 may output the generated detection signal to the input node $N_{IN}$. That is, the photo detector 110 may be a photoelectric conversion element that converts light energy into electrical energy. For example, the photo detector 110 may be a photo diode. In an exemplary embodiment, the intensity of the detection signal may be proportional to the intensity of light incident from outside. Also, the intensity of the detection signal may be proportional to a magnitude of a reverse bias voltage applied to the photo detector 110.

The log amplifier 120 may be an amplifier that is configured to receive the detection signal through the input node $N_{IN}$, to amplify the received detection signal in a log scale, and to output the amplified detection signal to the output node $N_{OUT}$. The log amplifier 120 may include a first buffer BF1, a first amplifier AMP1, and the feedback transistor $M_{FB}$. The first buffer BF1 may be connected between the input node $N_{IN}$ and the amplification node $N_{AMP}$ and may have an amplification gain of "1." The first amplifier AMP1 may be connected between the amplification node $N_{AMP}$ and the output node $N_{OUT}$. For example, the first amplifier AMP1 may be an inverting amplifier having an amplification gain "A".

The feedback transistor $M_{FB}$ may be connected between the power node Vdd and the input node $N_{IN}$ and may be configured to operate in response to a voltage of the output node $N_{OUT}$. For example, the feedback transistor $M_{FB}$ may include a gate node connected with the output node $N_{OUT}$ and a source node connected with the input node $N_{IN}$.

The dynamic vision sensor device may include a second buffer BF2 between the log amplifier 120 and the differencing amplifier 130. The second buffer BF2 may have an amplification gain of "1." The second buffer BF2 may be configured to receive the amplified detection signal through the output node $N_{OUT}$ and to output the amplified detection signal to the differencing amplifier 130. In an exemplary embodiment, the second buffer BF2 may be omitted. In this case, the log amplifier 120 may output the amplified detection signal to the differencing amplifier 130 through the output node $N_{OUT}$.

The differencing amplifier 130 may receive the detection signal amplified by the log amplifier 120 through the output node $M_{AMP}$ and the second buffer BF2. The differencing amplifier 130 may be configured to output a difference signal based on a change in the intensity of the amplified detection signal. The differencing amplifier 130 may include a first capacitor $C_1$, a second capacitor $C_2$, and a second amplifier AMP2.

The first capacitor $C_1$ may be connected between the second buffer BF2 and a difference node $N_{DF}$. The first capacitor $C_1$ may receive the amplified detection signal through the second buffer BF2. In an exemplary embodiment, in the case where the second buffer BF2 is omitted, the first capacitor $C_1$ may be connected between the output node $N_{OUT}$ and the difference node $N_{DF}$. The first capacitor $C_1$ may receive the amplified detection signal through the output node $N_{OUT}$.

The second capacitor $C_2$ may be connected with the first capacitor $C_1$ through the difference node $N_{DF}$. The second capacitor $C_2$ may be connected with the event determination circuit 140 through a comparison node $N_{COMP}$. The second capacitor $C_2$ may be a capacitor connected between an input terminal and an output terminal of the second amplifier AMP2.

The second amplifier AMP2 may receive the amplified detection signal from the capacitor $C_1$ through the difference node $N_{DF}$. The second amplifier AMP2 may generate the difference signal based on a change in the intensity of the amplified detection signal. The second amplifier AMP2 may output the difference signal to the comparison node $N_{COMP}$.

The differencing amplifier 130 may further include a switch SW that controls the difference signal. The switch SW may receive the reset signal RST from the output logic circuit 150. The switch SW may set a voltage level of the difference signal to the reset voltage in response to the reset signal RST.

The event determination circuit 140 may receive the difference signal from the differencing amplifier 130 through the comparison node $N_{COMP}$. The event determination circuit 140 may output the ON event signal ON or the OFF event signal OFF based on the difference signal. The event determination circuit 140 may include the ON comparator 141 and the OFF comparator 142.

When the voltage level of the difference signal is smaller than the ON reference value, the ON comparator 141 may output the ON event signal ON indicating that the intensity of light incident onto the photo detector 110 increases. When the voltage level of the difference signal is greater than the OFF reference value, the OFF comparator 142 may output the OFF event signal OFF indicating that the intensity of light incident onto the photo detector 110 decreases.

In this case, because the differencing amplifier 130 includes the second amplifier AMP2 being an inverting amplifier, a voltage level of the difference signal when the intensity of light increases may be lower than a voltage level of the difference signal when the intensity of light decreases. That is, the OFF reference value may be greater than the ON reference value. For example, the second amplifier AMP2 may be an inverting amplifier having an amplification gain "A".

The output logic circuit 150 may receive the ON event signal ON or the OFF event signal OFF from the event determination circuit 140. The output logic circuit 150 may output the reset signal RST for controlling the difference signal to the differencing amplifier 130 in response to the ON event signal ON or the OFF event signal OFF from the event determination circuit 140.

The output logic circuit 150 may communicate with the controller 12. The output logic circuit 150 may receive a selection signal SEL from the controller 12. The selection signal SEL may be a signal for selecting a dynamic vision sensor device, which will output an event signal, from among a plurality of dynamic vision sensor devices. For example, the selection signal SEL may be a signal for selecting a dynamic vision sensor device corresponding to a specific pixel among a plurality of pixels.

The output logic circuit 150 may output a request signal RQ to the controller 12 based on the selection signal SEL, the ON event signal ON, and the OFF event signal OFF. The request signal RQ may be a signal for requesting processing of event information corresponding to a change sensed by the photo detector 110. The event information may be information indicating that the intensity of an incident light increases or decreases. For example, the request signal RQ may be an event signal.

The output logic circuit 150 may receive an acknowledge signal ACK from the controller 12. The acknowledge signal ACK may be a signal indicating that the controller 12 normally receives or processes the event information corresponding to the request signal RQ.

The output logic circuit 150 may output the reset signal RST to the differencing amplifier 130 based on the received acknowledge signal ACK. That is, as the event information corresponding to a previous ON event signal ON or a previous OFF event signal OFF is normally processed, the output logic circuit 150 may output the reset signal RST allowing a voltage level of the difference signal generated at the differencing amplifier 130 to be set to the reset voltage and may wait for an input of a new ON event signal ON or a new OFF event signal OFF.

In an exemplary embodiment, the output logic circuit 150 may include an event memory configured to store the ON event signal ON or the OFF event signal OFF. For example, from when the ON event signal ON or the OFF event signal OFF is received to when the selection signal SEL is received, the output logic circuit 150 may store event information corresponding to the ON event signal ON or the OFF event signal OFF in the event memory.

Figure 16:
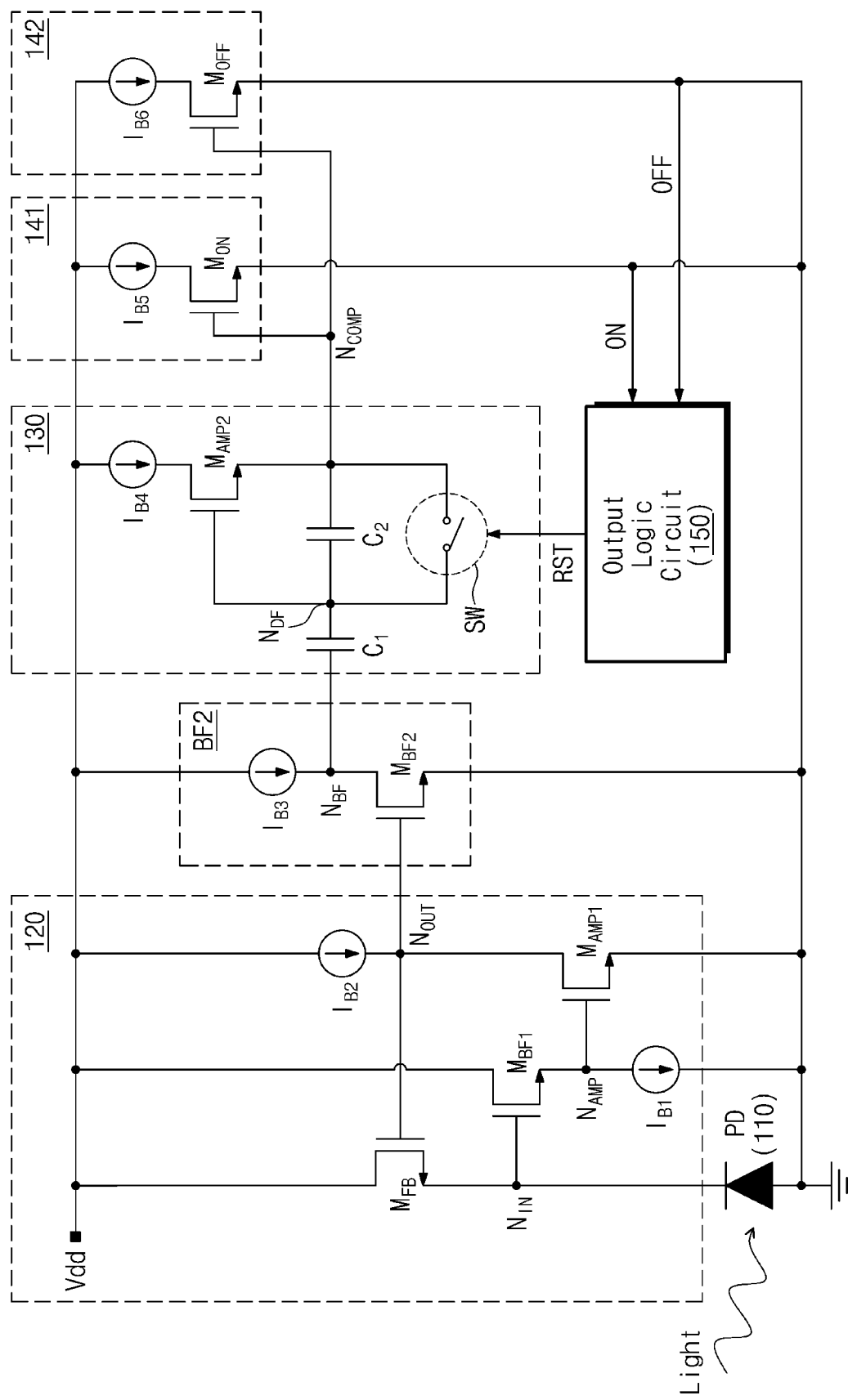
FIG. 16 is a circuit diagram illustrating a pixel circuit of a dynamic vision sensor device of FIG. 15.

FIG. 16 is a circuit diagram illustrating a pixel circuit of a dynamic vision sensor device of FIG. 15. The dynamic vision sensor device in which the log amplifier 120, the differencing amplifier 130, the ON comparator 141, and the OFF comparator 142 are implemented in a transistor level is illustrated in FIG. 16. Characteristics of the photo detector 110, the feedback transistor $M_{FB}$, the first and second capacitors $C_1$ and $C_2$, the switch SW, and the output logic circuit 150 are similar to the characteristics of the photo detector 110, the feedback transistor $M_{FB}$, the first and second capacitors $C_1$ and $C_2$, the switch SW, and the output logic circuit 150 of FIG. 15, and thus, additional description will be omitted to avoid redundancy.

The log amplifier 120 may include a first buffer transistor $M_{BF1}$, the first amplification transistor $M_{AMP1}$, the feedback transistor $M_{FB}$, the first current bias $I_{B1}$, and the second current bias $I_{B2}$. The first current bias $I_{B1}$ may be connected with the amplification node $N_{AMP}$. The second current bias $I_{B2}$ may be connected with the output node $N_{OUT}$.

The first buffer transistor $M_{BF1}$ may be connected between the power node Vdd and the amplification node $N_{AMP}$ and may be configured to operate in response to a voltage of the input node $N_{IN}$. For example, the first buffer transistor $M_{BF1}$ may include a gate node connected with the input node $N_{IN}$ and a source node connected with the amplification node $N_{AMP}$.

The first amplification transistor $M_{AMP1}$ may be connected between the output node $M_{AMP}$ and the ground node and may be configured to operate in response to a voltage of the amplification node $N_{AMP}$. For example, the first amplification transistor $M_{AMP1}$ may include a gate node connected with the amplification node $N_{AMP}$ and a drain node connected with the output node $N_{OUT}$.

The dynamic vision sensor device may include a second buffer BF2 between the log amplifier 120 and the differencing amplifier 130. The second buffer BF2 may include a second buffer transistor $M_{BF2}$ and a third current bias $I_{B3}$. The third current bias $I_{B3}$ may be connected with a buffer node $N_{BF}$.

The second buffer transistor $M_{BF2}$ may be connected between the buffer node $N_{BF}$ and the ground node and may be configured to operate in response to a voltage of the output node $N_{OUT}$. The second buffer transistor $M_{BF2}$ may include a source node connected with the ground node, a gate node connected with the output node $N_{OUT}$, and a drain node connected with the buffer node $N_{BF}$. That is, the drain node of the second buffer transistor $M_{BF2}$ may be connected with the third current bias $I_{B3}$.

In an exemplary embodiment, the second buffer BF2 may be omitted. In this case, the log amplifier 120 may be directly connected with the differencing amplifier 130 through the output node $N_{OUT}$. For example, the drain node of the first amplification transistor $M_{AMP1}$ and the first capacitor $C_1$ may be directly connected through the output node $N_{OUT}$.

The differencing amplifier 130 may include the first and second capacitors $C_1$ and $C_2$, the switch SW, the second amplification transistor $M_{AMP2}$, and a fourth current bias $I_{B4}$. The fourth current bias $I_{B4}$ may be connected with a drain node of the second amplification transistor $M_{AMP2}$. The second amplification transistor $M_{AMP2}$ may be connected between the fourth current bias $I_{B4}$ and the comparison node $N_{COMP}$ and may operate in response to a voltage of the difference node $N_{DF}$. For example, the second amplification transistor $M_{AMP2}$ may include a gate node connected with the difference node $N_{DF}$ and a source node connected with the comparison node $N_{COMP}$.

The ON comparator 141 may include an ON transistor $M_{ON}$ and a fifth current bias $I_{B5}$. The fifth current bias $I_{B5}$ may be connected with a drain node of the ON transistor $M_{ON}$. The ON transistor $M_{ON}$ may receive the difference signal through a gate node connected with the comparison node $N_{COMP}$. When a voltage level of the received difference signal is smaller than the ON reference value, the ON transistor $M_{ON}$ may output the ON event signal ON to the output logic circuit 150 through a source node.

The OFF comparator 142 may include an OFF transistor $M_{OFF}$ and a sixth current bias $I_{B6}$. The sixth current bias $I_{B6}$ may be connected with a drain node of the OFF transistor $M_{OFF}$. The OFF transistor $M_{OFF}$ may receive the difference signal through a gate node connected with the comparison node $N_{COMP}$. When a voltage level of the received difference signal is greater than the OFF reference value, the OFF transistor $M_{OFF}$ may output the OFF event signal OFF to the output logic circuit 150 through a source node.

According to an embodiment of the disclosure, as a buffer is added, a parasitic capacitance decreases, and a response speed to a change of a photocurrent is improved. Accordingly, a dynamic vision sensor device capable of improving performance associated with detection of a light change is provided.

Also, as the buffer is added, a reverse bias voltage of a photo detector increases, and a magnitude of a current generated at the photo detector increases. Accordingly, a dynamic vision sensor device capable of improving performance associated with detection of a light change is provided.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While the disclosure has been described with reference to exemplary embodiments thereof, it will be apparent to those of ordinary skill in the art that various changes and modifications may be made thereto without departing from the spirit and scope of the disclosure as set forth in the following claims.

What is claimed is:

1. A dynamic vision sensor device comprising:
   a photo detector configured to output a detection signal based on incident light;
   a log amplifier configured to receive the detection signal from the photo detector through a first node, to amplify the detection signal and thereby generate an amplified detection signal, and to output the amplified detection signal to a second node;
   a differencing amplifier configured to output a difference signal based on a change in an intensity of the amplified detection signal; and
   an event determination circuit configured to determine an event based on the difference signal, wherein:
   the log amplifier includes:
      a first buffer connected between the first node and a third node;

an amplifier connected between the third node and the second node; and a feedback circuit connected between the second node and the first node.

2. The dynamic vision sensor device of claim 1, wherein the feedback circuit includes a first transistor connected between a power node and the first node and configured to operate in response to a voltage of the second node.

3. The dynamic vision sensor device of claim 1, wherein the feedback circuit includes:
a first transistor connected between a power node and a fourth node and configured to operate in response to a voltage of the second node, and
a boosting circuit connected between the fourth node and the first node and configured to amplify a voltage of the fourth node and thereby generate an amplified voltage and to output the amplified voltage to the first node.

4. The dynamic vision sensor device of claim 3, wherein the boosting circuit includes a second transistor connected between the fourth node and the first node and configured to operate in response to the voltage of the fourth node.

5. The dynamic vision sensor device of claim 3, wherein:
the boosting circuit includes a second transistor connected between the fourth node and the first node and configured to operate in response to a voltage of a fifth node, and
the amplifier includes:
a third transistor connected between the second node and the fifth node and configured to operate in response to the voltage of the fourth node;
a fourth transistor connected between the fifth node and a ground node and configured to operate in response to a voltage of the third node; and
a first current bias connected with the second node.

6. The dynamic vision sensor device of claim 3, wherein the boosting circuit includes:
a second transistor connected between the fourth node and the first node and configured to operate in response to a voltage of a sixth node,
a fifth transistor connected between the power node and the sixth node and configured to operate in response to the voltage of the fourth node, and
a second current bias connected with the sixth node.

7. The dynamic vision sensor device of claim 1, wherein the feedback circuit includes:
a boosting circuit connected between the second node and a seventh node and configured to amplify a voltage of the second node and thereby generate an amplified voltage and to output the amplified voltage to the seventh node, and
a sixth transistor connected between the seventh node and the first node and configured to operate in response to a voltage bias.

8. The dynamic vision sensor device of claim 1, wherein the feedback circuit includes:
a first transistor connected between a power node and a fourth node, and configured to operate in response to a voltage of the second node,
a boosting circuit connected between the fourth node and a seventh node and configured to amplify a voltage of the fourth node and thereby generate an amplified voltage and to output the amplified voltage to the seventh node, and
a sixth transistor connected between the seventh node and the first node and configured to operate in response to a voltage bias.

9. The dynamic vision sensor device of claim 8, wherein:
the first transistor is an NMOS transistor including a source node connected with the fourth node, a gate node connected with the second node, and a drain node connected with the power node, and
the sixth transistor is a PMOS transistor including a source node connected with the seventh node, a gate node connected with the voltage bias, and a drain node connected with the first node.

10. The dynamic vision sensor device of claim 1, further comprising a second buffer configured to receive the amplified detection signal from the log amplifier through the second node and to output the amplified detection signal to the differencing amplifier.

11. The dynamic vision sensor device of claim 1, wherein:
the event determination circuit is further configured to determine the event to output an ON event signal or an OFF event signal,
the dynamic vision sensor device further comprises an output logic circuit configured to output a reset signal for controlling the difference signal to the differencing amplifier when the ON event signal or the OFF event signal is received from the event determination circuit, and
the differencing amplifier includes:
a first capacitor configured to receive the amplified detection signal from a first amplifier through the second node;
a second capacitor connected with the first capacitor through an eighth node and connected with the event determination circuit through a ninth node;
a second amplifier configured to output the difference signal to the ninth node based on the amplified detection signal received from the first capacitor through the eighth node; and
a switch connected with the eighth node, the ninth node, and the output logic circuit, and configured to set a voltage level of the difference signal at the ninth node to a reset voltage in response to the reset signal received from the output logic circuit.

12. The dynamic vision sensor device of claim 1, wherein:
the event includes an ON event indicating that an intensity of the incident light increases, and an OFF event indicating that the intensity of the incident light decreases, and
the event determination circuit includes:
an ON comparator configured to determine the ON event when a voltage level of the difference signal is smaller than a first reference value; and
an OFF comparator configured to determine the OFF event when the voltage level of the difference signal is greater than a second reference value greater than the first reference value.

13. A dynamic vision sensor device comprising:
a photo detector configured to output a detection signal based on incident light;
a log amplifier configured to receive the detection signal from the photo detector through a first node, to amplify the detection signal and thereby generate an amplified detection signal, and to output the amplified detection signal to a second node;
a differencing amplifier configured to output a difference signal based on a change in an intensity of the amplified detection signal; and an event determination circuit configured to determine an event based on the difference signal, wherein:

the log amplifier includes:
- a first transistor connected between a power node and a third node, and configured to operate in response to a voltage of the first node;
- a second transistor connected between the second node and a ground node and configured to operate in response to a voltage of the third node; and
- a third transistor connected between the power node and the first node and configured to operate in response to a voltage of the second node.

14. The dynamic vision sensor device of claim 13, wherein the log amplifier further includes:
   a first current bias connected with the third node, and
   a second current bias connected with the second node.

15. The dynamic vision sensor device of claim 13, wherein:
   the first transistor includes a source node connected with the third node, a gate node connected with the first node, and a drain node connected with the power node,
   the second transistor includes a source node connected with the ground node, a gate node connected with the third node, and a drain node connected with the second node, and
   the first and second transistors are NMOS transistors.

16. The dynamic vision sensor device of claim 13, wherein the third transistor is an NMOS transistor including a source node connected with the first node, a gate node connected with the second node, and a drain node connected with the power node.

17. A dynamic vision sensor device comprising:
   a photo detector configured to output a detection signal based on incident light;
   a log amplifier configured to receive the detection signal from the photo detector through a first node, to amplify the detection signal and thereby generate an amplified detection signal, and to output the amplified detection signal to a second node;
   a differencing amplifier configured to output a difference signal based on a change in an intensity of the amplified detection signal; and
   an event determination circuit configured to determine an event based on the difference signal, wherein:

the log amplifier further includes:
- a first transistor connected between a third node and a ground node and configured to operate in response to a voltage of the first node;
- a second transistor connected between a power node and the second node, and configured to operate in response to a voltage of the third node; and
- a third transistor connected between the power node and the first node and configured to operate in response to a voltage of the second node.

18. The dynamic vision sensor device of claim 17, wherein the log amplifier further includes:
   a first current bias connected with the third node, and
   a second current bias connected with the second node.

19. The dynamic vision sensor device of claim 17, wherein:
   the first transistor includes a source node connected with the third node, a gate node connected with the first node, and a drain node connected with the ground node,
   the second transistor includes a source node connected with the power node, a gate node connected with the third node, and a drain node connected with the second node, and
   the first and second transistors are PMOS transistors.

20. The dynamic vision sensor device of claim 17, wherein the third transistor is an NMOS transistor including a source node connected with the first node, a gate node connected with the second node, and a drain node connected with the power node.

* * * * *